United States Patent
Lin et al.

(10) Patent No.: US 8,694,325 B2
(45) Date of Patent: Apr. 8, 2014

(54) HIERARCHICAL AUDIO CODING, DECODING METHOD AND SYSTEM

(75) Inventors: Zhibin Lin, Nanjing (CN); Zheng Deng, Nanjing (CN); Hao Yuan, Shenzhen (CN); Jing Lu, Nanjing (CN); Xiaojun Qiu, Nanjing (CN); Jiali Li, Shenzhen (CN); Guoming Chen, Shenzhen (CN); Ke Peng, Shenzhen (CN); Kaiwen Liu, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 145 days.

(21) Appl. No.: 13/505,064

(22) PCT Filed: Oct. 26, 2010

(86) PCT No.: PCT/CN2010/078126
§ 371 (c)(1),
(2), (4) Date: Apr. 30, 2012

(87) PCT Pub. No.: WO2011/063694
PCT Pub. Date: Jun. 3, 2011

(65) Prior Publication Data
US 2012/0226505 A1      Sep. 6, 2012

(30) Foreign Application Priority Data

Nov. 27, 2009 (CN) .......................... 2009 1 0249855

(51) Int. Cl.
| G10L 19/00 | (2013.01) |
| G10L 21/04 | (2013.01) |
| G10L 19/02 | (2013.01) |
| G10L 11/04 | (2006.01) |

(52) U.S. Cl.
USPC ........... 704/500; 704/203; 704/206; 704/229; 704/501; 704/502; 704/503; 704/504

(58) Field of Classification Search
CPC ... G10L 19/00; G10L 19/002; G10L 19/0204; G10L 19/0208; G10L 19/0212; G10L 19/032; G10L 19/038; G10L 19/12; G10L 19/24

USPC .......................... 704/203, 206, 229, 500–504
See application file for complete search history.

(56) References Cited

U.S. PATENT DOCUMENTS 5,684,920 A     11/1997   Iwakami et al.
6,289,308 B1 *   9/2001   Lokhoff ........................ 704/229

(Continued)

FOREIGN PATENT DOCUMENTS

| CN | 101044552 A | 9/2007 |
| CN | 101206860 A | 6/2008 |

(Continued)

OTHER PUBLICATIONS

"G.729-based embedded variable bit-rate coder: an 8-32 kbit/s scalable wideband coder bitstream interoperable with G.729", ITU-T Recommendation G/729.1, May 2006, pp. 1-91.*

(Continued)

*Primary Examiner* — Edgar Guerra-Erazo
(74) *Attorney, Agent, or Firm* — Brooks Kushman P.C.

(57) ABSTRACT

A hierarchical audio coding, decoding method and system are provided. The method includes dividing frequency domain coefficients of an audio signal after MDCT into a plurality of coding sub-bands, quantizing and coding amplitude envelope values of coding sub-bands; allocating bits to each coding sub-band of the core layer, quantizing and coding core layer frequency domain coefficients to obtain coded bits of core layer frequency domain coefficients; calculating the amplitude envelope value of each coding sub-band of the core layer residual signal; allocating bits to each coding sub-band of the extended layer, quantizing and coding the extended layer coding signal to obtain coded bits of the extended layer coding signal; multiplexing and packing amplitude value envelope coded bits of each coding sub-band composed by core layer and extended layer frequency domain coefficients, core layer frequency coefficients coded bits, and extended layer coding signal coded bits, then transmitting to the decoding end.

22 Claims, 12 Drawing Sheets

(56) References Cited

U.S. PATENT DOCUMENTS

| | | | |
|---|---|---|---|
| 7,729,905 B2 * | 6/2010 | Sato et al. | 704/219 |
| 7,752,052 B2 * | 7/2010 | Oshikiri | 704/500 |
| 7,835,904 B2 * | 11/2010 | Li et al. | 704/200.1 |
| 7,974,839 B2 * | 7/2011 | Sung et al. | 704/219 |
| 8,069,048 B2 * | 11/2011 | Kim et al. | 704/500 |
| 8,099,275 B2 | 1/2012 | Oshikiri | |
| 8,374,853 B2 * | 2/2013 | Ragot et al. | 704/220 |
| 2003/0009325 A1 * | 1/2003 | Kirchherr et al. | 704/211 |
| 2005/0163323 A1 * | 7/2005 | Oshikiri | 381/22 |
| 2006/0122830 A1 | 6/2006 | Lee et al. | |
| 2007/0233467 A1 * | 10/2007 | Oshikiri | 704/201 |
| 2008/0262835 A1 * | 10/2008 | Oshikiri | 704/205 |
| 2009/0262945 A1 | 10/2009 | Teo et al. | |
| 2012/0146831 A1 * | 6/2012 | Eksler | 341/200 |
| 2013/0030796 A1 * | 1/2013 | Liu | 704/205 |

FOREIGN PATENT DOCUMENTS

| | | |
|---|---|---|
| CN | 101253557 A | 8/2008 |
| CN | 101521014 A | 9/2009 |
| CN | 101562015 A | 10/2009 |
| EP | 2101318 A1 | 9/2009 |
| JP | 2009042734 A | 2/2009 |

OTHER PUBLICATIONS

International Search Report for PCT/CN2010/078126, English translation attached to original, Both completed by the Chinese Patent Office on Jan. 18, 2011, All together 10 Pages.

* cited by examiner

HIERARCHICAL AUDIO CODING, DECODING METHOD AND SYSTEM

TECHNICAL FIELD

The present invention relates to a hierarchical audio coding, decoding method and system.

BACKGROUND ART

Hierarchical audio coding refers to organizing code streams of audio coding in a manner of hierarchy, generally it is to divide into a core layer and several extended layers. A decoder may only decode the code streams of lower-layer (such as the core layer) in the absence of code streams of higher-layer (such as the extended layer) coding, and the more the decoded layers are, the higher the tone quality is.

The hierarchical coding technology is of very significant utility value for the communication network. On one hand, data transmission may be completely jointly by different channels, and the packet loss ratio of each channel may be different, in which case, hierarchical processing usually needs to be performed for the data, wherein the important part in the data is transmitted in a stable channel with a relatively low packet loss ratio, while the less important part of the data is transmitted in a non-stable channel with a relatively high packet loss ratio, thereby ensuring that only relative decrease of tone quality, rather than complete failure of decoding of a frame of data, occurs when the packets are lost in the non-stable channel. On the other hand, the bandwidths of certain communication networks (such as the Internet) is not stable, and the bandwidths of different users are different, so the requirements of users with different bandwidths cannot be met simultaneously by using a fixed code rate, while the hierarchical coding scheme can enable different users to obtain the optimal tone quality enjoyment under the bandwidth condition owned by themselves.

In the conventional hierarchical audio coding scheme, for example the standard G.729.1 and G.VBR of ITU (International Telecommunication Union), the core layer uses audio coding, while the extended layer adopts time domain or transform domain coding. The coding scheme of the core layer is independent of that of the extended layer, which will result in a low coding efficiency and also influence the quality of music signal coding in a transmission condition of medium/lower code rate. In other hierarchical schemes, for example, the coding scheme of BSAC (Bit-Slice Arithmetic Code) variable (or retractable) code rate adopted by MPEG4 (Moving Picture Experts Group 4), bit allocation and hierarchical operation are only implemented based on the size of the datum itself without considering the residual perception distribution characteristics of the whole signal per se, so the existing information of the core layer cannot be utilized to help the extended layer to perform coding, thus resulting in a relatively low coding efficiency.

SUMMARY OF THE INVENTION

The technical problem to be solved in the present invention is to overcome the deficiency of the prior art by providing a hierarchical audio coding, decoding method and system with a high efficiency.

In order to solve the above technical problem, the present invention provides a hierarchical audio coding method, comprising the following steps of:

dividing frequency domain coefficients of an audio signal for which a Modified Discrete Cosine Transform (MDCT) has been performed into core layer frequency domain coefficients and extended layer frequency domain coefficients, dividing the core layer frequency domain coefficients and extended layer frequency domain coefficients into a plurality of coding sub-bands, and quantizing and coding amplitude envelope values of the coding sub-bands;

allocating bits to each coding sub-band of a core layer according to an amplitude envelope value of each coding sub-band of the core layer, and then quantizing and coding the core layer frequency domain coefficients to obtain coded bits of the core layer frequency domain coefficients;

calculating an amplitude envelope value of each coding sub-band of a core layer residual signal according to the amplitude envelope value and a bit allocation number of each coding sub-band of the core layer;

allocating the bits to each coding sub-band of an extended layer according to an extended layer coding signal composed of the core layer residual signal and the extended layer frequency domain coefficients and the amplitude envelope value of each coding sub-band composed of the extended layer coding signal, and then quantizing and coding the extended layer coding signal to obtain coded bits of the extended layer coding signal; and multiplexing and packing amplitude value envelope coded bits of each coding sub-band composed of the core layer frequency domain coefficients and the extended layer frequency domain coefficients, the coded bits of the core layer frequency domain coefficients, and the coded bits of the extended layer coding signal, and then transmitting to a decoding end.

In addition, in said step of dividing frequency domain coefficients of an audio signal for which Modified Discrete Cosine Transform (MDCT) has been performed into core layer frequency domain coefficients and extended layer frequency domain coefficients, dividing the core layer frequency domain coefficients and extended layer frequency domain coefficients into a plurality of coding sub-bands, dividing the frequency domain coefficients after MDCT into a plurality of uniformly-spaced coding sub-bands, or dividing into a plurality of non-uniform coding sub-bands according to auditory perceptive characteristics; grouping low-frequency coding sub-bands as core layer coding sub-bands and grouping high-frequency coding sub-bands as extended layer coding sub-bands.

In addition, bit allocation with variable step lengths is implemented for each coding sub-band according to the amplitude envelope values of the coding sub-bands;

during the process of bit allocation, a step length of bit allocation is 1 bit, and a step length of importance reduction after bit allocation is 1 for a coding sub-band whose bit allocation number is 0, a step length of bit allocation for allocating bits additionally is 0.5 bit and a step length of importance reduction after bit allocation is 0.5 for a coding sub-band whose bit allocation number is greater than 0 and less than a classification threshold, and a step length of bit allocation for allocating bits additionally is 1 bit and a step length of importance reduction after bit allocation is 1 for a coding sub-band whose bit allocation number is greater than or equal to the classification threshold;

the bit allocation number is a number of bits allocated to a single frequency domain coefficient in one coding sub-band.

In addition, in said step of quantizing and coding the core layer frequency domain coefficients and the extended layer coding signal, quantizing and coding to-be-quantized vectors of the coding sub-band whose bit allocation number is less than the classification threshold using pyramid lattice vector quantization, and quantizing and coding to-be-quantized vectors of the coding sub-band whose bit allocation number is greater than the classification threshold using sphere lattice vector quantization;

the bit allocation number is a number of bits allocated to a single frequency domain coefficient in one coding sub-band.

In addition, in said step of calculating an amplitude envelope value of each coding sub-band of a core layer residual signal according to the amplitude envelope value and a bit allocation number of each coding sub-band of the core layer, the amplitude envelope value of each coding sub-band of the core layer residual signal is calculated by the following way:

inversely quantizing the quantized value of the core layer frequency domain coefficient, and implementing a difference calculation with respect to the core layer frequency domain coefficients to obtain the core layer residual signal;

dividing the core layer residual signal into coding sub-bands in the same way as for the core layer frequency domain coefficient, and calculating the amplitude envelope value of each coding sub-band of the core layer residual signal according to the amplitude envelope value and the bit allocation number of each coding sub-band of the core layer.

In addition, the step of calculating the amplitude envelope value of each coding sub-band of the core layer residual signal comprises: calculating an amplitude envelope quantization exponent of each coding sub-band of the core layer, and implementing a difference calculation with respect to a quantization exponent modification value of a corresponding coding sub-band to obtain the amplitude envelope quantization exponent of each coding sub-band of the core layer residual signal;

wherein, the quantization exponent modification value of each coding sub-band is greater than or equal to 0, and does not decrease when the bit allocation number of the corresponding coding sub-band of the core layer increases; and when the bit allocation number of a coding sub-band of the core layer is 0, the quantization exponent modification value being 0, and when the bit allocation number of the coding sub-band of the core layer is a defined maximum bit allocation number, the amplitude envelope value of the core layer residual signal in the coding sub-band being 0.

In addition, the quantization exponent modification value of a coding sub-band is obtained according to the bit allocation number of the core layer, and when the bit allocation number of the coding sub-band of the core layer is 0, 1, 1.5, 2, 2.5, 3, 3.5, 4, 4.5, 5, 6, 7 or 8 respectively, the quantization exponent modification value corresponding to the coding sub-band is 0, 1, 2, 3, 4, 5, 5, 6, 7, 7, 9, 10 or 12 respectively;

in addition, said step of obtaining the coded bits of the core layer frequency domain coefficients comprises:

calculating the amplitude envelope quantization exponent of each coding sub-band of the core layer, and allocating bits to each coding sub-band of the core layer; and normalizing the frequency domain coefficient of each coding sub-band using a quantization amplitude envelope value of each coding sub-band of the core layer reconstructed according to the amplitude envelope quantization exponent of each coding sub-band of the core layer, and quantizing and coding according to the bit allocation number of each coding sub-band of the core layer using pyramid lattice vector quantization and sphere lattice vector quantization respectively to obtain the coded bits of the core layer frequency domain coefficients;

wherein, said step of obtaining the coded bits of the extended layer coding signal comprises:

constituting the extended layer coding signal with the core layer residual signal and the extended layer frequency domain coefficients;

allocating bits to each coding sub-band of the extended layer according to the amplitude envelope quantization exponent of each coding sub-band of the extended layer coding signal; and normalizing the coding signal of each coding sub-band using a quantization amplitude envelope value of each coding sub-band of the extended layer reconstructed according to the amplitude envelope quantization exponent of each coding sub-band of the extended layer, and quantizing and coding according to the bit allocation number of each coding sub-band of the extended layer using pyramid lattice vector quantization and sphere lattice vector quantization respectively to obtain the coded bits of the extended layer coding signal.

In addition, in said step of multiplexing and packing amplitude value envelope coded bits of each coding sub-band composed of the core layer frequency domain coefficients and the extended layer frequency domain coefficients, the coded bits of the core layer frequency domain coefficients, and the coded bits of the extended layer coding signal, and then transmitting to a decoding end, multiplexing and packing are implemented according to the following code stream format:

writing side information bits of the core layer after a frame header of a code stream, writing the amplitude value envelope coded bits of the coding sub-band of the core layer into a bit stream multiplexer MUX, and then writing the coded bits of the core layer frequency domain coefficients into the MUX; and writing side information bits of the extended layer into the MUX, writing the amplitude value envelope coded bits of the coding sub-band of the extended layer frequency domain coefficients into the MUX, and then writing the coded bits of the extended layer coding signal into the MUX;

the bits whose number meets the code rate requirements are sent to the decoding end according to the required code rate.

In addition, the coded bits of the extended layer coding signal are written into the code stream according to an initial value of importance of each coding sub-band in a descending order, and are sent to the decoding end.

In addition, the side information of the core layer includes Huffman coding flag bits of coding sub-band amplitude envelope composed of MDCT coeffcients, Huffman coding flag bits of the core layer frequency domain coefficients and bits of the number of iterations;

the side information of the extended layer includes Huffman coding flag bits of the extended layer coding signal and bits of the number of iterations.

In addition, said step of sending the bits whose number meets code rate requirements to the decoding end comprises:

coding the core layer and the extended layer within the range of a whole frequency band in which coding is needed according to the number of bits for a defined maximum coding rate such that the maximum coding rate is reached within the range of the coding frequency band;

after the coded bits of the core layer, writing the coded bits of the extended layer coding signal into the bit stream multiplexer according to the initial value of importance of each coding sub-band in a descending order; and sending the bits whose meets the code rate requirements to the decoding end based on a principle that the coded bits of the coding sub-band with a smaller initial value of importance are firstly rejected;

wherein, the code rate corresponding to the core layer is marked as L0 layer, each code rate corresponding to the extended layer is marked as L1_1 layer, L1_2 layer, up to L1_K layer according to the number of rejected bits of the extended layer, wherein, the code rate of the L1_K layer is precisely the maximum coding rate.

In addition, the range of the coding frequency band is 0-13.6 kHz, and when the maximum coding rate is 64 kbps, the bits whose number meets the code rate requirements are sent to the decoding end in a coding rate hierarchy way as below:

grouping the MDCT frequency domain coefficients within 0-6.4 kHz among the range of 0-13.6 kHz of the coding frequency band into a core layer, the maximum code rate corresponding to the core layer being 32 kbps and marked as L0 layer; the range of the coding frequency band of the extended layer being 0-13.6 kHz, and its maximum code rate being 64 kbps and marked as $L_1\_5$ layer;

before being sent to the decoding end, the code rate is divided, according to the number of rejected bits, into $L_1\_1$ layer corresponding to 36 kbps, $L_1\_2$ layer corresponding to 40 kbps, $L_1\_3$ layer corresponding to 48 kbps, $L_1\_4$ layer corresponding to 56 kbps, and $L_1\_5$ layer corresponding to 64 kbps.

In addition, after said step of dividing frequency domain coefficients of an audio signal for which Modified Discrete Cosine Transform (MDCT) has been performed into core layer frequency domain coefficients and extended layer frequency domain coefficients, the method further comprises:

dividing the extended layer frequency domain coefficients, in an ascending order of frequencies, into M parts, which are frequency domain coefficients of extended layers from extended layer 1 to extended layer M respectively, wherein, the frequency for the frequency domain coefficient in the extended layer 1 is the lowest and the frequency for the frequency domain coefficient in the extended layer M is the highest;

after said step of quantizing and coding the core layer frequency domain coefficients, the method further comprises: inversely quantizing the quantized value of the core layer frequency domain coefficient, and implementing a difference calculation with respect to the core layer frequency domain coefficient to obtain the core layer residual signal;

in said step of calculating an amplitude envelope value of each coding sub-band of a core layer residual signal according to the amplitude envelope value and a bit allocation number of each coding sub-band of the core layer, dividing the core layer residual signal into coding sub-bands with the same way as for the core layer, and calculating the amplitude envelope value of each coding sub-band of the core layer residual signal according to the amplitude envelope value and the bit allocation number of each coding sub-band of the core layer;

in said step of allocating the bits to each coding sub-band of an extended layer according to an extended layer coding signal composed of the core layer residual signal and the extended layer frequency domain coefficients and the amplitude envelope value of each coding sub-band composed of the extended layer coding signal, and then quantizing and coding the extended layer coding signal to obtain coded bits of the extended layer coding signal, constituting the coding signal of extended layer 1 with the core layer residual signal and the frequency domain coefficient of extended layer 1, calculating the amplitude envelope quantization exponent of each coding sub-band according to the coding signal of extended layer 1, and allocating bits to each coding sub-band of extended layer 1; quantizing and coding the coding signal of extended layer 1 according to the bit allocation number of each coding sub-band of extended layer 1;

inversely quantizing the quantized value of the coding signal of the extended layer i, and implementing a difference calculation with respect to the coding signal of extended layer i to obtain the residual signal of extended layer i;

dividing the residual signal of extended layer i into coding sub-bands with the same way as for extended layer i, and calculating the amplitude envelope value of each coding sub-band of the residual signal of extended layer i according to the amplitude envelope value and the bit allocation number of each coding sub-band of extended layer i;

constituting the coding signal of extended layer i+1 with the residual signal of extended layer i and the frequency domain coefficient of extended layer i+1, and allocating bits to each coding sub-band of extended layer i+1 according to the amplitude envelope quantization exponent of each coding sub-band of the coding signal of extended layer i+1; and normalizing, vector quantizing and coding the coding signal of each coding sub-band of extended layer i+1 using to a quantization amplitude envelope value and the number of coded bits of each coding sub-band of extended layer i+1 reconstructed according to the amplitude envelope quantization exponent of each coding sub-band of extended layer i+1 to obtain the coded bits of the coding signal of extended layer i+1;

said i=1, . . . . N−1, and N are positive integers greater than 2.

In addition, multiplexing and packing are implemented according to the following code stream format:

after the coded bits of the core layer, writing the bits of an extended layer with a smaller serial number into a bit stream multiplexer MUX, and then writing the bits of an extended layer with a greater serial number into the bit stream multiplexer MUX, i.e., writing the bits of extended layer i firstly, then writing the bits of extended layer i+1 into the MUX;

in the identical extended layer, writing side information bits of the extended layer into the MUX, writing the amplitude value envelope coded bits of the coding sub-band of the extended layer frequency domain coefficients into the MUX firstly, and then writing the coded bits of the extended layer coding signal into the MUX;

sending the bits whose number meets code rate requirements to the decoding end according to the required code rate.

In addition, the bits whose number meets the code rate requirements are sent to the decoding end in a coding rate hierarchy method as below:

coding the core layer and extended layers 1 to M within the range of a whole frequency band in which coding is needed according to the number of bits for a defined maximum coding rate such that the maximum coding rate is reached within the range of the coding frequency band;

after the coded bits of the core layer, preferentially writing the bits of an extended layer with a smaller serial number into the bit stream multiplexer, and then preferentially writing the coded bits of coding sub-band with a greater initial value of importance into the bit stream multiplexer in the identical extended layer;

for each extended layer, rejecting the unnecessary bits in the rear part of the bit stream multiplexer according to code rate design requirements in each layer, i.e., sending the bits whose number meets the code rate requirements to the decoding end according to a principle that the coded bits of the coding sub-band with a smaller initial value of importance are firstly rejected;

marking the code rate corresponding to the core layer as a L0 layer, marking the maximum code rate corresponding to each extended layer as $L_1\_K_1$ layer, $L_2\_K_2$ layer, up to $L_M\_K_M$ layer respectively according to defined requirements for transmission code rates, wherein, the code rate of the $L_M\_K_M$ layer is precisely the maximum code rate required by a coder;

further dividing a code rate layer between extended layer i and extended layer i+1 according to the number of rejected bits, i.e., subdividing into Li+1_1 layer, Li+1_2 layer, up to Li+1_Ki+1 layer between $L_1\_K$, layer and $L_{i+1}\_K_{i+1}$ layer according to the number of rejected bits.

In addition, the range of the coding frequency band is 0-20 kHz, and when the maximum coding rate is 96 kbps, the bits whose number meets the code rate requirements is sent to the decoding end in a coding rate hierarchy method as below:

grouping the MDCT frequency domain coefficients within 0-6.4 kHz among the range of 0-20 kHz of the coding frequency band into a core layer, the maximum code rate corresponding to the core layer being 32 kbps and marked as L0 layer;

the range of the coding frequency band of extended layer 1 being 0-13.6 kHz, and its maximum code rate being 64 kbps and marked as $L_1\_5$ layer; the range of the coding frequency band of extended layer 2 being 0-20 kHz, and its maximum code rate being 96 kbps and marked as $L_2\_2$ layer;

before being sent to the decoding end, further dividing $L_1\_5$ layer and $L_2\_2$ layer into $L_2\_1$ layer corresponding to 80 kbps, and $L_2\_2$ layer corresponding to 96 kbps according to the number of rejected bits.

The present invention further provides a hierarchical audio decoding method, comprising the following steps of:

de-multiplexing a bit stream sent by a coding end, and decoding amplitude envelope coded bits of core layer frequency domain coefficients to obtain an amplitude envelope value of each coding sub-band of the core layer;

allocating bits to each sub-band of the core layer according to the amplitude envelope value of each coding sub-band of the core layer, and calculating an amplitude envelope value of a residual signal of the core layer; decoding amplitude envelope coded bits of extended layer frequency domain coefficients to obtain an amplitude envelope value of the extended layer frequency domain coefficients; allocating bits to each coding sub-band of an extended layer according to the amplitude envelope value of the residual signal of the core layer and amplitude envelope value of the extended layer frequency domain coefficients; and respectively decoding coded bits of the core layer frequency domain coefficients and coded bits of an extended layer coding signal according to a bit allocation number of the core layer and a bit allocation number of the extended layer to obtain the core layer frequency domain coefficients and the extended layer coding signal, rearranging the extended layer coding signal according to an order of frequency bands, and adding with the core layer frequency domain coefficients to obtain frequency domain coefficients of a whole bandwidth, performing inverse Modified Discrete Cosine Transform (IMDCT) on the frequency domain coefficients of a whole bandwidth to obtain an output audio signal.

In addition, the way for calculating the amplitude envelope value of the residual signal is:

the step of calculating the amplitude envelope value of the residual signal of the core layer comprises:

calculating an amplitude envelope quantization exponent of each coding sub-band of the core layer, and implementing a difference calculation with respect to a quantization exponent modification value of a corresponding coding sub-band to obtain the amplitude envelope quantization exponent of each coding sub-band of the residual signal of the core layer;

calculating the amplitude envelope value of each sub-band of the residual signal of extended layer i according to the amplitude envelope and the bit allocation number of each coding sub-band of extended layer i;

the quantization exponent modification value of each coding sub-band being greater than or equal to 0, and not decreasing when the bit allocation number of the corresponding coding sub-band of the core layer increases; and when the bit allocation number of a coding sub-band of the core layer is 0, the quantization exponent modification value being 0, and when the bit allocation number of the coding sub-band is a defined maximum bit allocation number, the amplitude envelope value of the core layer residual signal in the coding sub-band being 0.

In addition, the quantization exponent modification value of a coding sub-band is obtained according to the bit allocation number of the core layer, and when the bit allocation number of the coding sub-band of the core layer is 0, 1, 1.5, 2, 2.5, 3, 3.5, 4, 4.5, 5, 6, 7 or 8 respectively, the quantization exponent modification value corresponding to the coding sub-band is 0, 1, 2, 3, 4, 5, 5, 6, 7, 7, 9, 10 or 12 respectively;

In addition, said step of obtaining the core layer frequency domain coefficients and the extended layer coding signal comprises:

decoding, inversely quantizing and inversely normalizing the coded bits of the core layer frequency domain coefficients according to the bit allocation number, quantization amplitude envelope value and side information of each coding sub-band of the core layer to obtain the core layer frequency domain coefficients; and decoding, inversely quantizing and inversely normalizing the coded bits of the extended layer coding signal according to the bit allocation number of each coding sub-band of the extended layer, the quantization amplitude envelope value and side information of the extended layer coding signal to obtain the extended layer coding signal.

In addition, in said step of decoding the coded bits of the extended layer coding signal, the coded bits of the extended layer coding signal are decoded in the following order:

in different extended layers, the order for decoding various layers is: firstly decoding the coded bits of each coding sub-band and the amplitude envelope of a lower extended layer with a smaller extended layer serial number, and then decoding the coded bits of each coding sub-band and the amplitude envelope of a higher extended layer with a greater extended layer serial number, the number of decoded bits is calculated during the decoding, and decoding is terminated when the number of decoded bits meets requirements on the total number of bits;

in an identical extended layer, the order for decoding various sub-bands is determined by an initial value of importance of each coding sub-band, a coding sub-band with a greater importance is preferentially decoded, and if there are two coding sub-bands with the same importance, then a lower-frequency coding sub-band is preferentially decoded, the number of decoded bits is calculated during the decoding, and decoding is terminated when the number of decoded bits meets requirements on the total number of bits.

In addition, when a code rate by which the bits are sent from a coding end to a decoding end is 64 kbps, different numbers of bits are intercepted at the decoding end to decode, and the decoding rate may be 36 kbps, 40 kbps, 48 kbps, 56 kbps or 64 kbps.

When a code rate by which the bits are sent from a coding end to a decoding end is 96 kbps, different numbers of bits are intercepted at the decoding end to decode, and the decoding rate may be 80 kbps or 96 kbps.

The present invention further provides a hierarchical audio coding system, comprising: a Modified Discrete Cosine Transform (MDCT) unit, an amplitude envelope calculating unit, an amplitude envelope quantizing and coding unit, a core layer bit allocating unit, a core layer frequency domain coefficient vector quantizing and coding unit, and a bit stream multiplexer; the system further comprises: an extended layer coding signal generating unit, a residual signal amplitude envelope generating unit, an extended layer bit allocating unit, and an extended layer coding signal vector quantizing and coding unit; wherein:

the MDCT unit is configured to perform Modified Discrete Cosine Transform for an input audio signal to generate core layer frequency domain coefficients and extended layer frequency domain coefficients;

the amplitude envelope calculating unit is configured to divide a to-be-coded part in the core layer frequency domain coefficients and extended layer frequency domain coefficients into a core layer frequency domain coefficient coding sub-band and an extended layer frequency domain coefficient coding sub-band, and calculate an amplitude envelope value of each coding sub-band;

the amplitude envelope quantizing and coding unit is configured to quantize and code the amplitude envelope values of the core layer frequency domain coefficient coding sub-band and extended layer frequency domain coefficient coding sub-band to generate an amplitude envelope quantization exponent and coded bits of amplitude envelope of each of the core layer frequency domain coefficient coding sub-band and the extended layer frequency domain coefficient coding sub-band;

the core layer bit allocating unit is configured to allocate bits to the core layer to obtain a bit allocation number of each coding sub-band of the core layer;

the core layer frequency domain coefficient vector quantizing and coding unit is configured to normalize, vector quantize and code the frequency domain coefficients of each coding sub-band of the core layer using a quantization amplitude envelope value and bit allocation number of each coding sub-band of the core layer reconstructed according to the amplitude envelope quantization exponent of each coding sub-band of the core layer to obtain coded bits of the core layer frequency domain coefficients;

the extended layer coding signal generating unit is configured to generate a residual signal, and obtain an extended layer coding signal composed of the residual signal and extended layer frequency domain coefficients;

the residual signal amplitude envelope generating unit is configured to obtain an amplitude envelope quantization exponent of each coding sub-band of the residual signal according to an amplitude envelope quantization exponent of each coding sub-band of the core layer and a bit allocation number of a corresponding coding sub-band;

the extended layer bit allocating unit is configured to allocate bits to an extended layer according to the amplitude envelope quantization exponent of each coding sub-band of the residual signal and the amplitude envelope quantization exponent of each coding sub-band of the extended layer frequency domain coefficients to obtain a bit allocation number of each coding sub-band of the extended layer coding signal;

the extended layer coding signal vector quantizing and coding unit is configured to normalize, vector quantize and code the coding signal of each coding sub-band of the extended layer using a quantization amplitude envelope value and bit allocation number of each coding sub-band of the extended layer reconstructed according to the amplitude envelope quantization exponent of each coding sub-band of the extended layer to obtain coded bits of the extended layer coding signal;

the bit stream multiplexer is configured to pack the side information bits of the core layer, the coded bits of amplitude envelope of each coding sub-band of the core layer, the coded bits of the core layer frequency domain coefficients, the side information bits of the extended layer, the coded bits of each amplitude envelope of the extended layer frequency domain coefficients and the coded bits of the extended layer coding signal.

In addition, the extended layer coding signal generating unit further comprises a residual signal generating unit and an extended layer coding signal synthesizing unit;

the residual signal generating unit is configured to inversely quantize a quantized value of the core layer frequency domain coefficients, implement a difference calculation with respect to the core layer frequency domain coefficient to obtain the core layer residual signal;

the extended layer coding signal synthesizing unit is configured to synthesize the core layer residual signal and the extended layer frequency domain coefficient in an order of frequency bands to obtain the extended layer coding signal.

In addition, the residual signal amplitude envelope generating unit further comprises a quantization exponent modification value obtaining unit and a residual signal amplitude envelope quantization exponent calculating unit;

the quantization exponent modification value obtaining unit is configured to calculate the quantization exponent modification value of each coding sub-band of the residual signal according to the bit allocation number of each coding sub-band of the core layer, wherein, the quantization exponent modification value of each coding sub-band is greater than or equal to 0, and does not decrease when the bit allocation number of the corresponding coding sub-band of the core layer increases; when the bit allocation number of a coding sub-band of the core layer is 0, the quantization exponent modification value is 0, and when the bit allocation number of the coding sub-band of the core layer is a defined maximum bit allocation number, the amplitude envelope value of the core layer residual signal in the coding sub-band is 0;

the residual signal amplitude envelope quantization exponent calculating unit is configured to implement a difference calculation between an amplitude envelope quantization exponent of each coding sub-band of the core layer and a quantization exponent modification value of a corresponding coding sub-band to obtain the amplitude envelope quantization exponent of each coding sub-band of the core layer residual signal.

In addition, the bit stream multiplexer is configured to write the coded bits of the extended layer coding signal into the code stream according to an initial value of importance of each coding sub-band in a descending order, and for the coding sub-bands with the same importance, preferably write the coded bits of a lower-frequency coding sub-band into the code stream.

The present invention further provides a hierarchical audio decoding system, comprising: a bit stream de-multiplexer, a core layer amplitude envelope decoding unit, a core layer bit allocating unit, and a core layer decoding and inverse quantizing unit; the system further comprises: an extended layer amplitude envelope decoding unit, a core layer residual signal amplitude envelope generating unit, an extended layer bit allocating unit, an extended layer coding signal decoding and inverse quantizing unit, a frequency domain coefficient generating unit, a noise filling unit and an inverse Modified Discrete Cosine Transform (IMDCT) unit; wherein:

the core layer amplitude envelope decoding unit is configured to decode amplitude envelope coded bits of coding sub-bands of a core layer output by the bit stream de-multiplexer to obtain an amplitude envelope quantization exponent of each coding sub-band of the core layer;

the core layer bit allocating unit is configured to allocate bits to the core layer to obtain a bit allocation number of each coding sub-band of the core layer;

the core layer decoding and inverse quantizing unit is configured to obtain through calculation a quantization amplitude envelope value of each coding sub-band of the core layer according to the amplitude envelope quantization exponent of each coding sub-band of the core layer, and decode, inversely quantize and inversely normalize the coded bits of the core layer frequency domain coefficients output by the bit stream de-multiplexer using the bit allocation number and the quantization amplitude envelope value of each coding sub-band of the core layer to obtain the core layer frequency domain coefficients;

the extended layer amplitude envelope decoding unit is configured to decode the amplitude envelope coded bits of the core layer frequency domain coefficients output by the bit stream de-multiplexer to obtain an amplitude envelope quantization exponent of each coding sub-band of the core layer frequency domain coefficients;

the core layer residual signal amplitude envelope generating unit is configured to obtain through calculation an amplitude envelope quantization exponent of each coding sub-band of the residual signal according to the amplitude envelope quantization exponent of each coding sub-band of the core layer and the bit allocation number of a corresponding coding sub-band;

the extended layer bit allocating unit is configured to allocate bits to an extended layer according to the amplitude envelope quantization exponent of each coding sub-band of the residual signal and the amplitude envelope quantization exponent of each coding sub-band of the extended layer frequency domain coefficients to obtain a bit allocation number of each coding sub-band of the extended layer coding signal;

the extended layer coding signal decoding and inverse quantizing unit is configured to obtain through calculation a quantization amplitude envelope value of each coding sub-band of the extended layer according to the amplitude envelope quantization exponent of each coding sub-band of the extended layer, and decode, inversely quantize and inversely normalize the coded bits of the extended layer coding signal output by the bit stream de-multiplexer using the bit allocation number and the quantization amplitude envelope value of each coding sub-band of the extended layer to obtain the extended layer coding signal;

the frequency domain coefficient generating unit is configured to rearrange the extended layer coding signal output by the extended layer coding signal decoding and inverse quantizing unit according to the order of the frequency bands, and then perform sum calculation with respect to the core layer frequency domain coefficients output by the core layer coding signal decoding and inverse quantizing unit to obtain a frequency domain coefficient output value;

the noise filling unit is configured to perform noise filling on the coding sub-bands to which no coded bit is allocated during the process of coding;

the IMDCT unit is configured to perform IMDCT on all frequency domain coefficients for which noise filling has been performed to obtain an output audio signal.

In addition, the core layer residual signal amplitude envelope generating unit further comprises a quantization exponent modification value obtaining unit and a residual signal amplitude envelope quantization exponent calculating unit;

the quantization exponent modification value obtaining unit is configured to calculate the quantization exponent modification value of each coding sub-band of the residual signal according to the bit allocation number of each coding sub-band of the core layer, and make adjustment according to an absolute value of the frequency domain coefficient of a corresponding coding sub-band, wherein, the quantization exponent modification value of each coding sub-band is greater than or equal to 0, and does not decrease when the bit allocation number of the corresponding coding sub-band of the core layer increases, and if the bit allocation number of a coding sub-band of the core layer is 0, the quantization exponent modification value is 0, and if the bit allocation number of the coding sub-band of the core layer is a defined maximum bit allocation number, the amplitude envelope value of the residual signal in the coding sub-band is 0;

the residual signal amplitude envelope quantization exponent calculating unit is configured to perform a difference calculation on the amplitude envelope quantization exponent of each coding sub-band and the quantization exponent modification value of the corresponding coding sub-band to obtain the amplitude envelope quantization exponent of each coding sub-band of the core layer residual signal.

In addition, the extended layer coding signal decoding and inverse quantizing unit is configured such that the order of decoding various sub-bands of the extended layer coding signal is determined by an initial value of importance of each coding sub-band, a coding sub-band with a greater importance is preferentially decoded, and if there are two coding sub-bands with the same importance, then a lower-frequency coding sub-band is preferentially decoded, the number of decoded bits is calculated during the decoding, and decoding is terminated when the number of decoded bits meets requirements on the total number of bits.

In conclusion, in the present invention, the identical method for sub-band division and bit allocation is applied in the core layer and the extended layer, the amplitude envelope information of the extended layer is calculated according to the amplitude envelope information of the core layer, and the distribution characteristics of the signals themselves are taken into full consideration in bit allocation of both the core layer and the extended layer such that the core layer and the extended layer are closely related with each other, and the code stream of the extended layer does not comprise the amplitude envelope information of the residual signal, thus improving the efficiency of hierarchical audio coding and decoding and meanwhile increasing the utilization ratio of codes.

PREFERRED EMBODIMENTS OF THE INVENTION

The core concept of the present invention is to compensate for the quantized noise in the core layer, use the same methods for sub-band division and bit allocation in the core layer and the extended layer, and calculate the amplitude envelope information of the residual signal of the core layer according to the amplitude envelope information of the core layer, which can improve the audio quality of the core layer without transmitting the amplitude envelope information of the residual signal in the code stream of the extended layer.

The present invention will be described in detail below with reference to the drawings and the examples.

Example One

Figure 1:
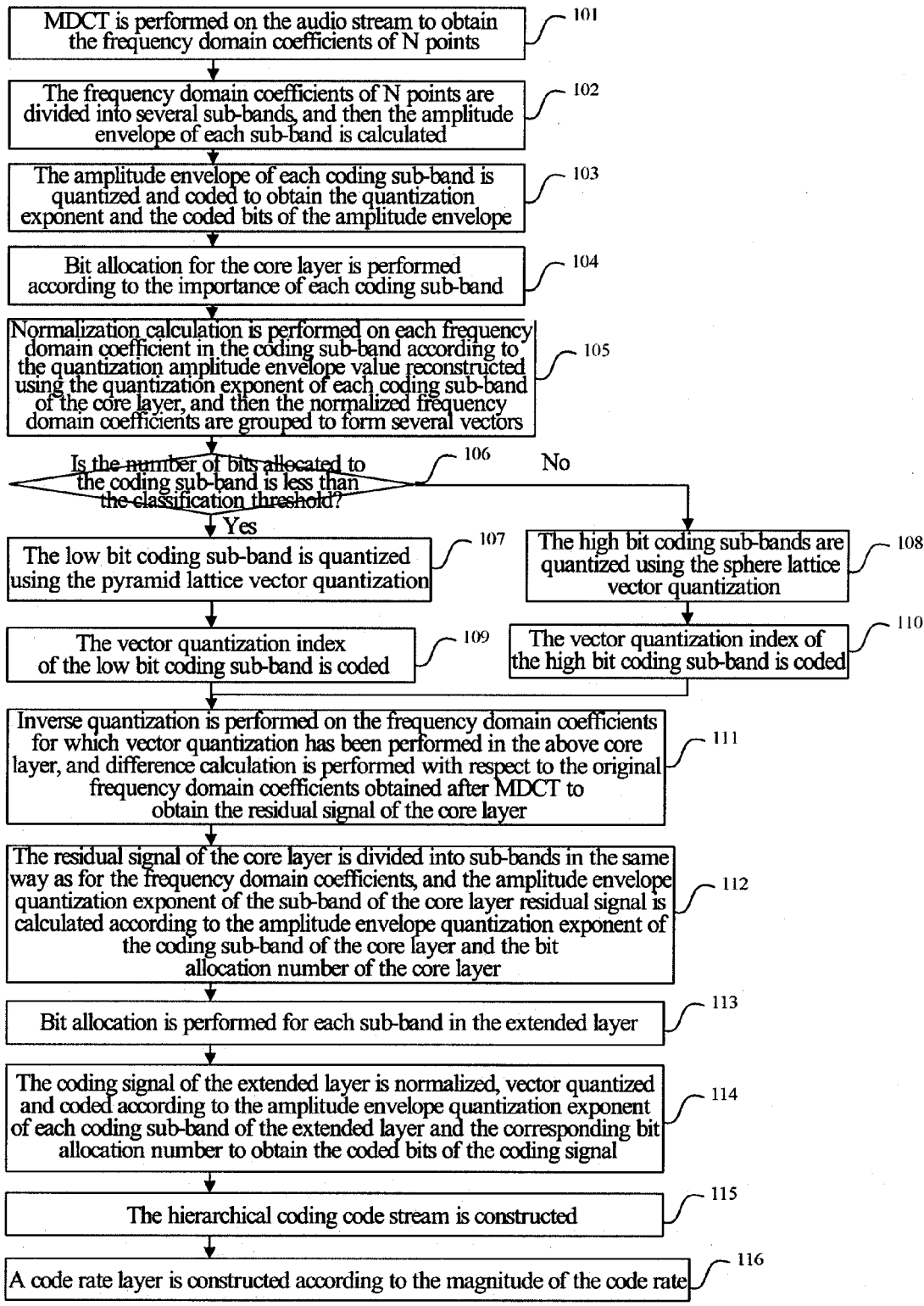
FIG. 1 is a flowchart of an enhanced hierarchical audio coding method according to Example one of the present invention.

FIG. 1 is a flowchart of an enhanced hierarchical audio coding method according to Example one of the present invention. In this example, the hierarchical audio coding method of the present invention will be described by taking an audio stream with a frame length of 20 ms and a sampling rate of 32 kHz as an example. The method of the present invention is also applicable in the conditions of other frame lengths and sampling rates. As shown in FIG. 1, the method comprises:

Step 101: MDCT (Modified Discrete Cosine Transform) is performed on the audio stream with a frame length of 20 ms and a sampling rate of 32 kHz to obtain the frequency domain coefficients on N frequency domain sampling points.

This step may be specifically implemented as follows:

when a N-point time domain sampling signal $x(n)$ of the current frame and a N-point time domain sampling signal $x_{old}(n)$ of the last frame constitute a 2N-point time domain sampling signal $\bar{x}(n)$, the time domain sampling signal of the 2N points may be represented by the following formula:

$$\bar{x}(n) = \begin{cases} x_{old}(n) & n = 0, 1, \ldots, N-1 \\ x(n-N) & n = N, N+1, \ldots, 2N-1 \end{cases} \quad (1)$$

MDCT is performed on $\bar{x}(n)$, obtaining the following frequency domain coefficients:

$$X(k) = \sum_{n=0}^{2N-1} \bar{x}(n)w(n)\cos\left[\frac{\pi}{N}\left(n + \frac{1}{2} + \frac{N}{2}\right)\left(k + \frac{1}{2}\right)\right] \quad (2)$$

$k = 0, \ldots, N-1$ wherein, $w(n)$ represents a sine window function, whose expression is:

$$w(n) = \sin\left[\frac{\pi}{2N}\left(n + \frac{1}{2}\right)\right] \quad (3)$$

$n = 0, \ldots, 2N-1$

In addition, when the frame length is 20 ms and the sampling rate is 32 kHz, N=640 (the corresponding N can also be calculated according to other frame lengths and sampling rates).

Step 102: the frequency domain coefficients of N points are divided into several sub-bands equally or unequally, and in this example, the sub-bands are divided unequally, and then the frequency domain amplitude envelope (referred to as amplitude envelope for short) of each sub-band is calculated.

This step may be implemented through the following sub-steps:

Step 102a: the frequency domain coefficients within the range of a frequency band which are to be coded are divided into L sub-bands (which may be called as coding sub-bands);

in this example, the range of the frequency band to be coded is 0-13.6 kHz, and it can be divided into sub-bands according to human auditory perceptive characteristics unequally. Table 1 provides a specific dividing mode.

In Table 1, the frequency domain coefficients within the range of the frequency band of 0-13.6 kHz are divided into 28 coding sub-bands, i.e., L=28; the frequency domain coefficients above 13.6 kHz are set to be 0s.

In this example, the frequency domain range of the core layer is also divided. The sub-bands from No. 0-15 in Table 1 are selected as the sub-bands of the core layer, and there are L_core=16 sub-bands in total. The frequency band range of the core layer is 0-6.4 kHz.

TABLE 1

| Serial No. of the sub-band | Starting frequency point (LIndex) | Ending frequency point (HIndex) | Bandwidth of the sub-band (BandWidth) |
|---|---|---|---|
| 0 | 0 | 7 | 8 |
| 1 | 8 | 15 | 8 |
| 2 | 16 | 23 | 8 |
| 3 | 24 | 31 | 8 |
| 4 | 32 | 47 | 16 |
| 5 | 48 | 63 | 16 |
| 6 | 64 | 79 | 16 |
| 7 | 80 | 95 | 16 |
| 8 | 96 | 111 | 16 |
| 9 | 112 | 127 | 16 |
| 10 | 128 | 143 | 16 |
| 11 | 144 | 159 | 16 |
| 12 | 160 | 183 | 24 |
| 13 | 184 | 207 | 24 |
| 14 | 208 | 231 | 24 |
| 15 | 232 | 255 | 24 |
| 16 | 256 | 279 | 24 |
| 17 | 280 | 303 | 24 |
| 18 | 304 | 327 | 24 |
| 19 | 328 | 351 | 24 |
| 20 | 352 | 375 | 24 |

TABLE 1-continued

| Serial No. of the sub-band | Starting frequency point (LIndex) | Ending frequency point (HIndex) | Bandwidth of the sub-band (BandWidth) |
|---|---|---|---|
| 21 | 376 | 399 | 24 |
| 22 | 400 | 423 | 24 |
| 23 | 424 | 447 | 24 |
| 24 | 448 | 471 | 24 |
| 25 | 472 | 495 | 24 |
| 26 | 496 | 519 | 24 |
| 27 | 520 | 543 | 24 |

Step 102b: the amplitude envelope of each coding sub-band is calculated according to the following formula:

$$Th(j) = \sqrt{\frac{1}{HIndex(j) - LIndex(j) + 1} \sum_{k=LIndex(j)}^{HIndex(j)} X(k)X(k)} \quad (4)$$

$$j = 0, 1, \ldots, L-1$$

wherein, LIndex(j) and HIndex(j) represent the starting frequency point and the ending frequency point of the $j^{th}$ coding sub-band respectively, and their specific values are as shown in Table 1.

Step 103: the amplitude envelope value of each coding sub-band is quantized and coded to obtain the quantization exponent of the amplitude envelope and the coded bits of the amplitude envelope, and the coded bits of the amplitude envelope need to be transmitted to the bit stream multiplexer (MUX).

The amplitude envelope of each coding sub-band is quantized using the following formula (5) to obtain the quantization exponent of the amplitude envelope of each coding sub-band, i.e., the output value of the quantizer:

$$Th_q(j) = \lfloor 2 \log_2 Th(j) \rfloor \quad (5)$$

wherein, $\lfloor x \rfloor$ represents round down, $Th_q(0)$ is the amplitude envelope quantization exponent of the first coding sub-band, whose range is limited within [−5, 34], i.e., when $Th_q(0) < -5$, $Th_q(0) = -5$; when $Th_q(0) > 34$, $Th_q(0) = 34$.

The quantization amplitude envelope reestablished according to the quantization exponent is $2^{Th_q(j)/2}$.

The amplitude envelope quantization exponent of the first coding sub-band is coded with 6 bits, i.e., 6 bits are consumed.

The values of differential operations between the amplitude envelope quantization exponents of various coding sub-bands are calculated according to the following formula:

$$\Delta Th_q(j) = Th_q(j+1) - Th_q(j) \quad j = 0, \ldots, L-2 \quad (6)$$

The amplitude envelope may be modified as follows in order to ensure that the range of $\Delta Th_q(j)$ is within [−15, 16]:

if $\Delta Th_q(j) < -15$, let $\Delta Th_q(j) = -15$, $Th_q(j) = Th_q(j+1) + 15$, $j = L-2, \ldots, 0$;

if $\Delta Th_q(j) > 16$, let $\Delta Th_q(j) = 16$, $Th_q(j+1) = Th_q(j) + 16$, $j = 0, \ldots, L-2$;

Huffman coding is performed on $\Delta Th_q(j)$, $j = 0, \ldots L-2$, and the number of bits consumed at this moment (called as Huffman coded bits) is calculated. If the number of Huffman coded bits is greater than or equal to the number of bits fixedly allocated (which is greater than $(L-1) \times 5$ in this example), $\Delta Th_q(j)$, $j = 0, \ldots, L-2$ is not coded in Huffman coding mode, and the Huffman coding flag bit Flag_huff_rms is set to be 0; otherwise, $\Delta Th_q(j)$, $j = 0, L-2$ is coded using Huffman coding, and the Huffman coding flag bit Flag_huff_rms is set to be 1.

The coded bits of the amplitude envelope quantization exponent (i.e., the coded bits of the amplitude envelope differential value) and the Huffman coding flag bit need to be transmitted to the MUX.

Step 104: the initial value of importance of each coding sub-band of the core layer is calculated according to the code rate distortion theory and the amplitude envelope information of the coding sub-band, and bit allocation for the core layer is performed according to the importance of each coding sub-band.

This step may be implemented with the following sub-steps:

Step 104a: a bit consumption average value of a single frequency domain coefficient of the core layer is calculated:

from the total number of bits that can be provided by a frame length of 20 ms bits_available, the number of bits for core layer coding bits_available_core, the number of bits consumed by the side information of the core layer bit_sides_core, and the number of bits consumed by the amplitude envelope quantization exponent of the coding sub-band of the core layer bits_Th_core, are deducted to obtain the number of left bits bits_left_core that can be used for coding the frequency domain coefficients of the core layer, i.e.:

bits_left_core=bits_available_core−bit_sides_core−bits_Th_core (7)

The side information comprises Huffman coding flags Flag_huff_rms, Flag_huff_PLVQ and the bits of the number of iterations count. Flag_huff_rms is used to mark whether Huffman coding is applied to the amplitude envelope quantization exponents of the coding sub-bands of the core layer and the extended layer; Flag_huff_PLVQ_core is used to mark whether Huffman coding is used when vector coding is performed on the frequency domain coefficients, and the number of iterations count is used to indicate the number of iterations during bit allocation modification (see the description in subsequent steps for more details).

The bit consumption average value $\overline{R}$_core of a single frequency domain coefficient is calculated:

$$\overline{R}\_core = \frac{bits\_left\_core}{HIndex(L\_core - 1) + 1} \quad (8)$$

wherein, L_core is the number of coding sub-bands of the core layer.

Step 104b: the optimal bit value under the condition of the maximum quantization signal-to-noise ratio gain is calculated according to the code rate distortion theory:

the code rate distortion degree based on separate Gaussian distribution random variable is optimized through Lagrange method, and the optimal bit value under the condition of the maximum quantization signal-to-noise ratio gain of each coding sub-band can be obtained through the following calculation:

$$rr\_core(j) = [\overline{R}\_core + R_{min\_core}(j)], j = 0, \ldots, L\_core-1 \quad (9)$$

wherein, $$R_{min}\_core(j) = \frac{1}{2}[Th_q(j) - mean\_Th_q\_core] \, j = 0, \ldots, L\_core-1 \quad (10)$$

and $$\text{mean\_Th}_q\_core = \frac{1}{HIndex(L\_core-1)+1} \sum_{i=0}^{L\_core-1} Th_q(i)[HIndex(i) - LIndex(i) + 1] \quad (11)$$

Step 104c: the importance initial value of each coding sub-band during bit allocation is calculated:

the importance initial value of each coding sub-band for controlling bit allocation in practical bit allocation can be obtained using the above optimal bit value and the proportion factor conforming to the human auditory perceptive characteristics:

$$rk(j) = \alpha \times rr\_core(j) = \alpha[\overline{R}\_core + R_{min\_core}(j)], \quad j=0,\ldots,L\_core-1 \quad (12)$$

wherein, α is a proportion factor, which is associated with the code rate of coding and can be obtained through statistics and analysis, and it is generally 0<α<1 and is 0.4 in this example; rk(j) indicates the importance of the $j^{th}$ coding sub-band during bit allocation.

Step 104d: the bit allocation for the core layer is performed according to the importance of each coding sub-band; the specific description is as follows:

firstly the coding sub-band with the maximum value is found among various rk (j), and the serial number of the coding sub-band is supposed to be $j_k$, and then the number of coded bits region_bit($j_k$) of each frequency domain coefficient in the coding sub-band is increased while the importance of the coding sub-band is decreased; meanwhile, the total number of bits bit_band_used($j_k$) consumed for coding the sub-band is calculated; finally, the sum of the numbers of bits consumed by all coding sub-bands, sum(bit_band_used (j)), j=0, . . . ,L_core−1, is calculated; the above procedure is repeated until the sum of the number of consumed bits meets the maximum value under the limit condition of available bits.

The bit allocation method in this step may be represented by the following pseudo codes:

```
let region_bit(j)=0 , j=0, 1, . . . , L_core − 1;
for the coding sub-bands 0, 1, . . . , L_core − 1:
{
    find j_k = argmax [rk(j)];
           j=0,... ,L−1 if region_bit(j_k)< classification threshold
    {
        if region_bit(j_k)=0
    let region_bit(j_k) = region_bit(j_k) + 1;
        calculate bit_band_used(j_k) = region_bit(j_k) * BandWidth(j_k);
    let rk(j_k) = rk(j_k) − 1;
        or else, if region_bit(j_k)>=1
        let region_bit(jk) = region_bit(jk) + 0.5;
        calculate bit_band_used(j_k) = region_bit(j_k) * BandWidth(j_k)*0.5;
    let rk(j_k) = rk(j_k) − 0.5;
    }
        or else, if region_bit(j_k)>= classification threshold
        {
        let region_bit(j_k) = region_bit(j_k) + 1;

let rk(j_k) = { rk(j_k) − 1   if region_bit(j_k) < MaxBit
                  { −100          else                        ;

calculate bit_band_used(j_k) = region_bit(j_k)×BandWidth(j_k);
    }
    calculate bit_used_all = sum(bit_band_used(j))    j=0,
    1, . . . , L_core − 1;
``` if bit_used_all < bits_left_core − 24, retrun and find $j_k$ again in various coding sub-bands, and calcuatlte the bit alloation number (or called as the number of coded bits) circularly; wherien 24 is the maximum value of the width of the coding sub-band.
Or else, end circulation, calculate the bit allocation number and output the bit allocation number at this moment.
}

Finally, according to the importance of the sub-band, the left bits less than 24 are allocated to the coding sub-band that meet the requirements based on the following principle: 0.5 bit is preferably allocated to each frequency domain coefficient in the coding sub-band with the bit allocation of 1, and meanwhile the importance of the coding sub-band is decreased by 0.5; otherwise 1 bit is allocated to each frequency domain coefficient in the coding sub-band with the bit allocation of 0, and meanwhile the importance of the coding sub-band is decreased by 1 until bit_left−bit_used_all<4, the bit allocation ends.

The range of the value of the classification threshold is greater than or equal to 2 and less than or equal to 8, and in this examples its value may be 5.

Wherein, MaxBit is the maximum number of bits that can be allocated to a single frequency domain coefficient in a coding sub-band, whose unit is bit/frequency domain coefficient. In this example, MaxBit=9. This value can be adjusted according to the coding rate of the decoder. region_bit(j) is the number of bits allocated to a single frequency domain coefficient in the $j^{th}$ coding sub-band, i.e., the number of coded bits of a single frequency domain coefficient in the coding sub-band.

In addition, in this step, $Th_q(j)$ or $\lfloor \mu \times \log_2 [Th(j)] + v \rfloor$ may be taken as the initial value of bit allocation importance of each coding sub-band for bit allocation of the core layer, j=0, . . . ,L_core−1; μ>0.

Step 105: the normalization calculation is performed on each frequency domain coefficient in the coding sub-band according to the quantization amplitude envelope value reconstructed using the quantization exponent of each coding sub-band of the core layer, and then the normalized frequency domain coefficients are grouped to form several vectors;

the normalization processing is performed on all frequency domain coefficients $X_j$ of the coding sub-band using the quantization amplitude envelope $2^{Th_q(j)/2}$ of the coding sub-band j:

$$X_j^{normalized} = \frac{X_j}{2^{Th_q(j)/2}};$$

successive 8 coefficients in the coding sub-band are grouped to constitute one 8-dimensional vector. According to the division of the coding sub-bands in Table 1, the coefficients in the coding sub-band j can be precisely grouped to constitute Lattice_D8(j) 8-dimensional vectors. Each normalized and grouped 8-dimensional to-be-quantized vector may be represented as $Y_j^m$, wherein m indicates the position of 8-dimensional vector in the coding sub-band, and its range is from 0 to Lattice_D8(j)−1.

Step 106: the magnitude of the number of bits allocated to the coding sub-band j, region_bit(j), is judged, and if the number of allocated bits region_bit(j) is less than the classification threshold, steps 107 and 109 are executed, i.e., the to-be-quantized vector in the coding sub-band is quantized and coded using pyramid lattice vector quantization; if the number of allocated bits region_bit(j) is greater than or equal to the classification threshold, steps 108 and 110 are executed, i.e., the to-be-quantized vector in the coding sub-band is quantized and coded using sphere lattice vector quantization; the threshold value in this example adopts 5 bits.

Step 107: the low bit coding sub-band is quantized using pyramid lattice vector quantization, in which case, the number of bits allocated to the sub-band j meets: 1<=region_bit (j)<5.

The present invention adopts 8-dimensional lattice vector quantization method based on $D_8$ lattice point, wherein $D_8$ lattice point is defined as follows:

$$D_8 = \left\{ v = (v_1, v_2, \ldots, v_8)^T \in Z^8 \middle| \sum_{i=1}^{8} v_i = \text{even} \right\}$$

wherein, $Z^8$ represents 8-dimensional integer space. The method for mapping (i.e., quantizing) a 8-dimensional vector to the $D_8$ lattice point is described as follows:

It is supposed that x is any real number, f(x) indicates performing rounding quantization of the integer closer to x among the two integers adjacent to x, w(x) indicates performing rounding quantization of the integer farther away from x among the two integers adjacent to x. For any vector $X=(x_1, x_2, \ldots, x_8) \in R^8$, it may be also defined that $f(X)=(f(x_1), f(x_2), \ldots f(x_8))$. The minimum subscript among the components with the largest absolute value of the rounding quantization error is selected in f(X) and is marked as k, and thus it is defined that $g(X)=(f(x_1), f(x_2), \ldots w(x_k), \ldots, f(x_8))$, then one and only one of f(X) and g(X) is a value of $D_8$ lattice point, in which case, the quantization value of $D_8$ lattice point output by the quantizer is:

$$f_{D_8}(x) = \begin{cases} f(X), & \text{if } f(X) \in D_8 \\ g(X), & \text{if } g(X) \in D_8. \end{cases}$$

The method for quantizing the to-be-quantized vector to $D_8$ lattice point and the specific steps for solving the $D_8$ lattice point exponent are as follows:

Step 107a: the energy of the to-be-quantized vector is regulated;

It needs to perform energy regulation on the to-be-quantized vector before quantization. According to the number, region_bit(j), of bits allocated to the coding sub-band j where the to-be-quantized vector is located, the codebook serial number (index) corresponding to the number of bits, and the energy scaling factor (scale) are found in Table 2; then energy regulation is performed on the to-be-quantized vector according to the following formula:

$$\tilde{Y}_{j,scale}^{m} = (Y_j^m - a) * \text{scale(index)}$$

wherein, $Y_j^m$ represents the $m^{th}$ normalized 8-dimensional to-be-quantized vector in the coding sub-band j, $\tilde{Y}_{j,scale}^{m}$ represents the 8-dimensional vector after performing energy regulation on $Y_j^m$, $a=(2^{-6}, 2^{-6}, 2^{-6}, 2^{-6}, 2^{-6}, 2^{-6}, 2^{-6}, 2^{-6})$.

TABLE 2

Corresponding relationship between the number of bits in pyramid lattice vector quantization, codebook serial number, energy scaling factor, and the maximum pyramid surface energy radius

| Number of bits region_bit | Codebook serial number Index | Energy scaling factor Scale | Maximum pyramid surface energy radius LargeK |
|---|---|---|---|
| 1 | 0 | 0.5 | 2 |
| 1.5 | 1 | 0.65 | 4 |
| 2 | 2 | 0.85 | 6 |
| 2.5 | 3 | 1.2 | 10 |
| 3 | 4 | 1.6 | 14 |
| 3.5 | 5 | 2.25 | 22 |
| 4 | 6 | 3.05 | 30 |
| 4.5 | 7 | 4.64 | 44 |

Step 107b: the lattice point quantization is performed on the regulated vector;

the energy-regulated 8-dimensional vector $\tilde{Y}_{j,scale}^{m}$ is quantized onto the $D_8$ lattice point $\hat{Y}_j^m$:

$$\hat{Y}_j^m = f_{D_8}(\tilde{Y}_{j,scale}^{m})$$

wherein, $f_{D_8}(\bullet)$ represents a quantization operator for mapping a certain 8-dimensional vector to a $D_8$ lattice point.

Step 107c: the energy of $\tilde{Y}_{j,scale}^{m}$ is trunked according to the pyramid surface energy of the $D_8$ lattice point $\hat{Y}_j^m$;

the energy of the $D_8$ lattice point $\hat{Y}_j^m$ is calculated and is compared with the maximum pyramid surface energy radius LargeK(index) in the coding codebook. If it is not greater than the maximum pyramid surface energy radius, the index of the lattice point in the codebook is calculated; otherwise, energy truncation is performed on the regulated to-be-quantized vector $\tilde{Y}_{j,scale}^{m}$ of the coding sub-band, until the energy of the quantized lattice point of the energy-trunked to-be-quantized vector is not greater than the maximum pyramid surface energy radius; at this moment, a little energy of itself is continuously added for the energy-trunked to-be-quantized vector, until the energy of the $D_8$ lattice point to which it is quantized exceeds the maximum pyramid surface energy radius; the last $D_8$ lattice point whose energy does not exceed the maximum pyramid surface energy radius is taken as the quantization value of the to-be-quantized vector. The specific process can be described using the following pseudo codes:

calculate the pyramid surface energy of $\hat{Y}_j^m$, i.e., calculate the sum of various absolute values of the $m^{th}$ component in the coding sub-band j,

```
temp _ K = sum(|Ŷⱼᵐ|)
Ybak = Ŷⱼᵐ
Kbak = temp _ K
If temp_K> LargeK(index)
{
    While temp_K> LargeK(index)
    {
        Ỹⱼ,scaleᵐ = Ỹⱼ,scaleᵐ / 2,
        Ŷⱼᵐ = f_{D_8} (Ỹⱼ,scaleᵐ)
        temp _ K = sum(|Ŷⱼᵐ|)
    }
    w = Ỹⱼ,scaleᵐ /16
    Ybak = Ŷⱼᵐ
    Kbak = temp _ K
    While temp_K<= LargeK(index)
    {
        Ybak = Ŷⱼᵐ
        Kbak = temp _ K
        Ỹⱼ,scaleᵐ = Ỹⱼ,scaleᵐ + w
        Ŷⱼᵐ = f_{D_8} (Ỹⱼ,scaleᵐ)
        temp _ K = sum(|Ŷⱼᵐ|)
```

-continued

```
    }
  }
  Ỹⱼᵐ = Ybak
  temp_K = Kbak
``` the $\tilde{Y}_j^m$ at this moment is the last $D_8$ lattice point whose energy does not exceed the maximum pyramid surface energy radius, and temp_K is the energy of the lattice point.

Step 107d: the quantization index of the $D_8$ lattice point $\tilde{Y}_j^m$ in the codebook is generated;

The index of the $D_8$ lattice point $\tilde{Y}_j^m$ in the codebook is obtained through calculation according to the following steps. The specific steps are as follows:

Step 1: the lattice point on each pyramid surface is labeled separately according to the magnitude of the pyramid surface energy.

For an integer lattice point mesh $Z^L$ with the dimension being L, the pyramid surface whose energy radius is K is defined as:

$$S(L, K) = \left\{ Y = (y_1, y_2, \ldots, y_L) \in Z^L \,\bigg|\, \sum_{i=1}^{L} |y_i| = K \right\}$$

N(L, K) is marked as the number of lattice points in S(L, K), and for the integer lattice $Z^L$, N(L, K) has the following recursion relationship:

$N(L,0)=1\ (L\geq 0), N(0,K)=0\ (K\geq 1)$ $N(L,K)=N(L-1,K)+N(L-1,K-1)+N(L,K-1)\ (L\geq 1, K\geq 1)$ For the integer lattice point $Y=(y_1, y_2, \ldots, y_L) \in Z^L$ on the pyramid surface whose energy radius is K, it is labeled with a certain value b in $[0, 1, \ldots, N(L,K)-1]$, and b is called as the label of the lattice point. The steps for solving the label b are as follows:

Step 1.1: let b=0, i=1, k=K, l=L, and calculate N(m,n), (m<=L, n<=K) according to the above recursion formula. It is defined that:

$$\operatorname{sgn}(x) = \begin{cases} 1 & x > 0 \\ 0 & x = 0 \\ -1 & x < 0 \end{cases}$$

Step 1.2: if $y_i=0$, then b=b+0;
if $|y_i|=1$, then $$b = b + N(l-1, k) + \left[\frac{1 - \operatorname{sgn}(y_i)}{2}\right] N(l-1, k-1);$$

if $|y_i|>1$ then $$b = b + N(l-1, k) + 2\sum_{j=1}^{|y_i|-1} N(l-1, k-j) + \left[\frac{1 - \operatorname{sgn}(y_i)}{2}\right] N(l-1, k-|y_i|)$$

Step 1.3: $k=k-|y_i|$, $l=l-1$, $i=i+1$, if k=0 at this moment, then the searching ends, and b is the label of Y, otherwise, it is to proceed to step 1.2).

Step 2: lattice points on all pyramid surfaces are labeled uniformly.

The label of each lattice point in all pyramid surfaces is calculated according to the number of lattice points on each pyramid surface and the label of each lattice point in its own pyramid surface:

$$\operatorname{index\_b}(j, m) = b(j, m) + \sum_{kk=0}^{K-2} N(8, kk)$$

wherein, kk is an even number, and the index_b(j,m) at this moment is precisely the index of the $D_8$ lattice point $\tilde{Y}_j^m$ in the codebook, i.e., the index of the $m^{th}$ 8-dimensional vector in the coding sub-band j.

Step 107e: steps 107a-107d are repeated, till the indexes of the 8-dimensional vectors of all coding sub-bands whose coded bits are greater than 0 have been generated; it is to turn to step 109.

Step 108: the high bit coding sub-bands are quantized using sphere lattice vector quantization, and at this moment the number of bits allocated to the sub-band j meets: 5<=region_bit(j)<=9;

here, the 8-dimensional lattice vector quantization based on $D_8$ lattice is also adopted.

Step 108a: the following energy regulation is performed on the $m^{th}$ normalized to-be-quantized vector $Y_j^m$ of the coding sub-band according to the number of bits, region_bit(j), allocated to a single frequency domain coefficient in the coding sub-band j:

$\hat{Y}_j^m = \beta(Y_j^m - a)$ wherein, $a=(2^{-6}, 2^{-6}, 2^{-6}, 2^{-6}, 2^{-6}, 2^{-6}, 2^{-6}, 2^{-6})$ $$\beta = \frac{2^{\text{region\_bit}(j)}}{\text{scale}(\text{region\_bit}(j))},$$

and scale(region_bit(j)) represents the energy scaling factor when the bit allocation number of a single frequency domain coefficient in the coding sub-band is region_bit(j), and their corresponding relationship can be found in Table 3.

TABLE 3

Corresponding relationship between the bit allocation number of sphere lattice vector quantization and the energy scaling factor

| Bit allocation Number region_bit | Energy scaling factor scale |
|---|---|
| 5 | 6 |
| 6 | 6.2 |
| 7 | 6.5 |
| 8 | 6.2 |
| 9 | 6.6 |

Step 108b: the index vector of the $D_8$ lattice point is generated.

The $m^{th}$ to-be-quantized vector $\hat{Y}_j^m$ after energy scaling is performed in the coding sub-band j is mapped onto the $D_8$ lattice point $\tilde{Y}_j^m$:

$\tilde{Y}_j^m = f_{D_8}(\hat{Y}_j^m)$

It is judged whether $f_{D_8}(\tilde{Y}_j^m / 2^{\text{region\_bit}(j)})$ is a zero vector, i.e., whether all of its components are zero. If yes, it is called that the zero vector condition is met, otherwise, it is called that the zero vector condition is not met.

If the zero vector condition is met, the index vector can be obtained according to the following exponent vector generating formula:

$$k=(\tilde{Y}_j^m G^{-1}) \bmod 2^{region\_bit(j)}$$

the index vector k of the $D_8$ lattice point $\tilde{Y}_j^m$ at this moment is output, wherein G is the generator matrix of the $D_8$ lattice point and has the following format:

$$G = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \end{bmatrix}$$

If the zero vector condition is not met, the value of the vector $\hat{Y}_j^m$ is divided by 2, until the zero vector condition $f_{D_8}(\tilde{Y}_j^m/2^{region\_bit(j)})$ is met; the small multiple value w of the $\hat{Y}_j^m$ itself is backed up, then the reduced vector $\hat{Y}_j^m$ is added with the backup small multiple value w, and is quantized to the $D_8$ lattice point, and it is judged whether the zero vector condition is met; if not, the index vector k of the latest $D_8$ lattice point meeting the zero vector condition is obtained according to the index vector calculating formula, otherwise, the vector $\hat{Y}_j^m$ continues to be added with the backup small multiple value w, and then quantized to the $D_8$ lattice point, until the zero vector condition is not met; finally, the index vector k of the latest $D_8$ lattice point meeting the zero vector condition is obtained according to the index vector calculating formula; the index vector k of the $D_8$ lattice point $\tilde{Y}_j^m$ is output. This process may also be described using the following pseudo codes:

--- temp _ D = $f_{D_8}$ ($\tilde{Y}_j^m / 2^{region\_bit(j)}$)
Ybak = $\hat{Y}_j^m$
Dbak = temp _ D
While temp _ D ≠ 0
{
$\hat{Y}_j^m = \hat{Y}_j^m / 2$
$\tilde{Y}_j^m = f_{D_8}(\hat{Y}_j^m)$
temp _ D = $f_{D_8}$ ($\tilde{Y}_j^m / 2^{region\_bit(j)}$)
}
w = $\hat{Y}_j^m / 16$

---

Ybak = $\tilde{Y}_j^m$
Dbak = temp _ D
While temp _D = 0
{
Ybak = $\tilde{Y}_j^m$
Dbak = temp _ D
$\hat{Y}_j^m = \hat{Y}_j^m + w$
$\tilde{Y}_j^m = f_{D_8}(\hat{Y}_j^m)$
temp _ D = $f_{D_8}$ ($\tilde{Y}_j^m / 2^{region\_bit(j)}$)
}
$\tilde{Y}_j^m$ = Ybak
k = ($\tilde{Y}_j^m G^{-1}$) mod $2^{region\_bit(j)}$
turning to step 110;

---

Step 109: the vector quantization index of the low bit coding sub-band is coded, and at this moment, the number of bits allocated to the sub-band j meets: 1<=region_bit(j)<5;

the vector quantization index, index_b(j,k), of each 8-dimensional vector in each coding sub-band is obtained according to pyramid lattice vector quantization, wherein k indicates the $k^{th}$ 8-dimensional vector of the coding sub-band j. The steps for performing Huffman coding on the quantization index, index_b(j,k), are as follows:

Step 109a: in all coding sub-bands with the number of the allocated bits being greater than 1 and less than 5 except 2 in a single frequency domain coefficient, every four bits of natural binary code of each vector quantization index are grouped as one group and are subjected to Huffman coding.

Step 109b: in all coding sub-bands with the number of the allocated bits being 2 in a single frequency domain coefficient, the pyramid lattice vector quantization index of each 8-dimensional vector is coded using 15 bits. In the 15 bits, Huffman coding is performed on three 4-bits groups and one 3-bits group respectively.

Step 109c: when the number of bits allocated to the single frequency domain coefficient of the coding sub-band is 1, if the quantization index is less than 127, the quantization index is coded using 7 bits, and the 7 bits are divided into one 3-bits group and one 4-bits group, on which Huffman coding is performed respectively; if the quantization index is equal to 127, its natural binary code value is "1111 1110", the former 7 "1"s are divided into one 3-bits group and one 4-bits group, on which Huffman coding is performed respectively; if the quantization index is equal to 128, its binary code value is "1111 1111", the former 7 "1"s are divided into one 3-bits group and one 4-bits group, on which Huffman coding is performed respectively.

The method for performing Huffman coding on the quantization index can be described using the following pseudo codes:

--- in all coding sub-bands where region_bit(j) =1.5 and 2<region_bit(j)<5
{
n is in the range of [0, region_bit(j×8/4 - 1], and the following circulation is implemented with the step length being increased by 1:
{
shift index_b(j,k) by 4*n bits to the right,
calculate the lower 4 bits, tmp, of index_b(j,k), i.e., tmp = and(index_b(j,k), 15)
calculate the code word of tmp in the codebook and its bit consumption number:
plvq_codebook(j,k) = plvq_code(tmp+1);
plvq_count(j,k) = plvq_bit_count(tmp+1);
wherein plvq_codebook(j,k), and plvq_count(j,k) are the code word and bit consumption number of the $k^{th}$ 8-dimensional vector of the sub-band j in the Huffman coding codebook respectively; plvq_bit_count and plvq_code are found according to Table 4.
update the total bit consumption number after Huffman coding is used:
bit_used_huff_all = bit_used_huff_all + plvq_bit_count(tmp+1);
}
}

In the coding sub-band where region_bit(j) = 2
{
n is in the range of [0, region_bit(j)×8/4 - 2], and the following circulation is implemented with the step length being increased by 1:
{
shift index_b(j,k) by 4*n bits to the right,
calculate the lower 4 bits, tmp, of index_b(j,k) , i.e. tmp = and(index_b(j,k), 15)
calculate the code word of tmp in the codebook and its bit consumption number:
plvq_count(j,k) = plvq_bit_count (tmp+1);
plvq_codebook(j,k) = plvq_code (tmp+1);
wherein plvq_count(j,k) and plvq_codebook(j,k) are bit consumption number and the code word of the $k^{th}$ 8-dimensional vector of the sub-band j in the Huffman coding codebook respectively; plvq_bit_count and plvq_code are found according to Table 4.
update the total bit consumption number after Huffman coding:
bit_used_huff_all = bit_used_huff_all + plvq_bit_count(tmp+1);
}
{
a three-bit situation needs to be processed as below:
after shifting index_b(j,k) by [region_bit(j)×8/4 - 2]*4 bits to the right,
calculate the lower 3 bits, tmp, of index_b(j,k), i.e. tmp = and(index_b(j,k), 7)
calculate the code word of tmp in the codebook and its bit consumption number:
plvq_count(j,k) = plvq_bit_count _r2_3(tmp+1);
plvq_codebook(j,k) = plvq_code _r2_3(tmp+1);
wherein plvq_count(j,k) and plvq_codebook(j,k) are bit consumption number and the code word of the $k^{th}$ 8-dimensional vector of the sub-band j respectively; plvq_bit_count_r2_3 and plvq_code_r2_3 are found according to Table 5.
update the total bit consumption number after Huffman coding is used:
bit_used_huff_all = bit_used_huff_all + plvq_bit_count(tmp+1);
}
}
in the coding sub-band where region_bit(j) =1
{
if index_b(j,k)<127
{
{
calculate the lower 4 bits, tmp, of index_b(j,k), i.e. tmp = and(index_b(j,k), 15)
calculate the code word of tmp in the codebook and its bit consumption number:
plvq_count(j,k) = plvq_bit_count _r1_4(tmp+1);
plvq_codebook(j,k) = plvq_code _r1_4(tmp+1);
wherein plvq_count(j,k) and plvq_codebook(j,k) are Huffman bit consumption number and the code word of the $k^{th}$ 8-dimensional vector of the sub-band j respectively; plvq_bit_count_r1_4 and plvq_code_r1_4 are found according to Table 6.
update the total bit consumption number after Huffman coding is used:
bit_used_huff_all = bit_used_huff_all + plvq_bit_count(tmp+1);
}
{
a three-bit situation needs to be processed as below:
shift index_b(j,k) by four bits to the right,
calculate the lower 3 bits, tmp, of index_b(j,k), i.e., tmp = and(index_b(j,k), 7)
calculate the code word of tmp in the codebook and its bit consumption number:
plvq_count(j,k) = plvq_bit_count _r1_3(tmp+1);
plvq_codebook(j,k) = plvq_code _r1_3(tmp+1);
wherein plvq_count(j,k) and plvq_codebook(j,k) are Huffman bit consumption number and the code word of the $k^{th}$ 8-dimensional vector of the sub-band j respectively; plvq_bit_count_r1_3 and plvq_code_r1_3 are found according to Table 7.
update the total bit consumption number after Huffman coding is used:
bit_used_huff_all = bit_used_huff_all + plvq_bit_count(tmp+1);
}
}
if index_b(j,k)=127
{ its binary value is "1111 1110"
search the Huffman code table of Table 7 and Table 6 for the former three "1"s and the last four "1"s, and the calculating way is the same as that in the case where index_b(j,k)<127.
update the total bit consumption number after Huffman coding is used: 8 bits are needed in total.
{
if index_b(j,k)=128
{ its binary value is "1111 1111"
search the Huffman code table of Table 7 and Table 6 for the former three "1"s and the last four "1"s, and the calculating way is the same as that in the case where index_b(j,k)<127.
update the total bit consumption number after Huffman coding is used: 8 bits are needed in total.
}
}

TABLE 4

Huffman code table for pyramid lattice vector quantization

| Tmp | Plvq_bit_count | plvq_code |
|---|---|---|
| 0 | 2 | 0 |
| 1 | 4 | 6 |
| 2 | 4 | 1 |
| 3 | 4 | 5 |
| 4 | 4 | 3 |
| 5 | 4 | 7 |
| 6 | 4 | 13 |
| 7 | 4 | 10 |
| 8 | 4 | 11 |
| 9 | 5 | 30 |
| 10 | 5 | 25 |
| 11 | 5 | 18 |
| 12 | 5 | 9 |
| 13 | 5 | 14 |
| 14 | 5 | 2 |
| 15 | 4 | 15 |

TABLE 5

Huffman code table for pyramid lattice vector quantization

| Tmp | Plvq_bit_count_r2_3 | plvq_code_r2_3 |
|---|---|---|
| 0 | 1 | 0 |
| 1 | 4 | 1 |
| 2 | 4 | 15 |
| 3 | 5 | 25 |
| 4 | 3 | 3 |
| 5 | 3 | 5 |
| 6 | 4 | 7 |
| 7 | 5 | 9 |

TABLE 6

Huffman code table for pyramid lattice vector quantization

| Tmp | Plvq_bit_count_r1_4 | plvq_code_r1_4 |
|---|---|---|
| 0 | 3 | 7 |
| 1 | 5 | 13 |
| 2 | 5 | 29 |
| 3 | 4 | 14 |
| 4 | 4 | 3 |
| 5 | 4 | 6 |
| 6 | 4 | 1 |
| 7 | 4 | 0 |
| 8 | 4 | 8 |
| 9 | 4 | 12 |
| 10 | 4 | 4 |
| 11 | 4 | 10 |
| 12 | 4 | 9 |
| 13 | 4 | 5 |
| 14 | 4 | 11 |
| 15 | 4 | 2 |

TABLE 7

Huffman code table for pyramid lattice vector quantization

| Tmp | Plvq_bit_count_r1_3 | plvq_code_r1_3 |
|---|---|---|
| 0 | 2 | 1 |
| 1 | 3 | 0 |
| 2 | 3 | 2 |
| 3 | 4 | 7 |
| 4 | 4 | 15 |
| 5 | 3 | 6 |
| 6 | 3 | 4 |
| 7 | 3 | 3 |

Step 109d: it is judged whether Huffman coding can saves bits.

The collection of all low bit coding sub-bands is marked as C, and the total number of bits consumed by the quantization vector indexes of the 8-dimensional vectors in all coding sub-bands belonging to C after Huffman coding is performed, bit_used_huff_all, is calculated. bit_used_huff_all is compared with the total number of bits allocated to all coding sub-bands in C, sum(bit_band_used (j), j∈C), and if bit_used_huff_all<sum(bit_band_used (j), j∈C), the quantization vector index after Huffman coding is transmitted, and meanwhile the Huffman coding flag Flag_huff_PLVQ to be 1; otherwise, natural coding is performed on the quantization vector index directly, and the Huffman coding flag Flag_huff_PLVQ is set to be 0.

Step 109e: the bit allocation number is modified.

If the Huffman coding flag Flag_huff_PLVQ is 0, the bit allocation of the coding sub-band is not modified. If the Huffman coding flag Flag_huff_PLVQ is 1, the bit allocation of the coding sub-band is modified using the bits saved by Huffman coding.

Figure 2:
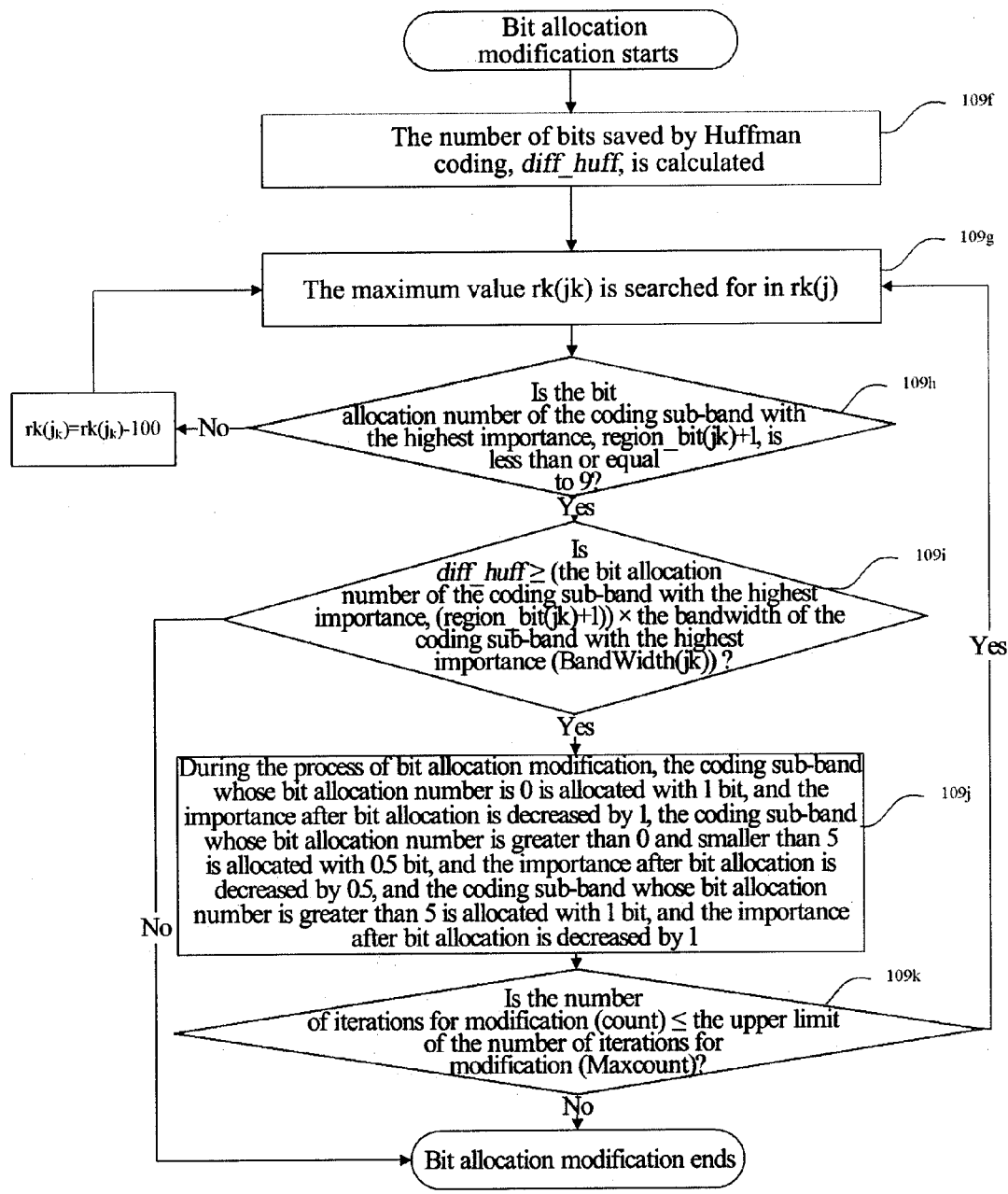
FIG. 2 is a flowchart of a method for bit allocation modification after vector quantization according to an example of the present invention.

As shown in FIG. 2, the flow for bit allocation modification specifically comprises the following steps:

Step 109f: the number of bits saved by Huffman coding is calculated, and letting count=0:

$$\text{diff\_huff} = \text{sum}(\text{bit\_band\_used}(j), j \in C) - \text{bit\_used\_huff\_all}$$

Step 109g: if diff_huff is greater than 0, the maximum value $rk(j_k)$ is searched for in each rk(j) (j=0, ... ,L−1), which is represented using the following formula:

$$j_k = \operatorname*{argmax}_{j=0,\ldots,L-1} [rk(j)]$$

Step 109h: whether region_bit($j_k$)+1 is less than or equal to 9 is judged, if yes, step 109i is executed; otherwise, the importance corresponding to $j_k$ is adjusted to be the lowest (for example, let rk($j_k$)=−100) to indicate that the bit allocation number of the coding sub-band does not need to be modified, and skip to step 109g.

Step 109i: it is judged whether diff_huff−(region_bit($j_k$)+1)×BandWidth($j_k$) is greater than or equal to 0, and if yes, step 109j is executed, i.e., the bit allocation number region_bit($j_k$) of the coding sub-band $j_k$ is modified, and the value of the importance of the sub-band rk($j_k$) is reduced, the number of iterations for bit allocation modification is made to be count=count+1, and vector quantization and Huffman coding are performed again on the coding sub-band $j_k$, and finally the value of diff_huff is updated; otherwise, the flow of bit allocation modification is ended.

Step 109j: during the process of bit allocation modification, the coding sub-band whose bit allocation number is 0 is allocated with 1 bit, and the importance after bit allocation is decreased by 1, the coding sub-band whose bit allocation number is greater than 0 and less than 5 is allocated with 0.5 bit, and the importance after bit allocation is decreased by 0.5, and the coding sub-band whose bit allocation number is greater than 5 is allocated with 1 bit, and the importance after bit allocation is decreased by 1.

Step 109k: it is judged whether the number of iterations for bit allocation modification, count, is less than or equal to Maxcount, if yes, it is to skip to step 109f; otherwise the flow of bit allocation modification is ended.

The above Maxcount is the upper-limit value of the number of iterations for bit allocation modification, and this value is determined by the coded bit stream and its sampling rate. In this example, Maxcount=31.

It is to turn to step 111.

Step 110: the vector quantization index of the high bit coding sub-band is coded, and at this moment the number of bits allocated to the sub-band j meets: 5<=region_bit(j)<=9.

According to the method in step 108, the 8-dimensional vectors in the coding sub-bands with the numbers of coded bits are from 5 to 9 are quantized to obtain the vector index k={k1, k2, k3, k4, k5, k6, k7, k8}, and each component of the index vector k is directly coded according to the number of bits allocated to a single frequency domain coefficient to obtain the coded bits of the vector.

Step 111: the inverse quantization is performed on the frequency domain coefficients for which vector quantization has been performed in the above core layer, and a difference calculation is performed with respect to the original frequency domain coefficients obtained after MDCT to obtain the residual signal of the core layer.

Step 112: the residual signal of the core layer is divided into sub-bands in the same way as for the frequency domain coefficients, and the amplitude envelope quantization exponent of the sub-band of the core layer residual signal is calculated according to the amplitude envelope quantization exponent of the coding sub-band of the core layer and the bit allocation number (i.e. each region_bit(j), j=0, . . . ,L_core−1) of the core layer.

This step may be implemented through the following substeps:

Step 112*a*: the modification value of the amplitude envelope quantization exponent of the core layer residual signal, diff(region_bit(j)), j=0, . . . ,L_core−1, is calculated according to the number of bits allocated to a single frequency domain coefficient in each coding sub-band of the core layer, region_bit(j), j=0, . . . ,L_core−1;

wherein, region_bit(j)=1, 1.5, 2, 2.5, 3, 3.5, 4, 4.5, 5, 6, 7, 8, j=0, . . . ,L_core−1, and the amplitude envelope quantization exponent modification value can be configured through the following rules:

diff(region_bit(j))≥0; and when region_bit(j)>0, diff(region_bit(j)) does not decrease as the value of region_bit(j) increases.

In order to obtain better coding and decoding effects, statistics can be made on the difference between the sub-band amplitude envelope quantization exponent calculated with respect to each bit allocation number (region_bit) and the sub-band amplitude envelope quantization exponent directly calculated from the residual signal to obtain the amplitude envelope quantization exponent modification value with the highest probability, as shown in Table 8:

TABLE 8

| region_bit | diff |
|---|---|
| 1 | 1 |
| 1.5 | 2 |
| 2 | 3 |
| 2.5 | 4 |
| 3 | 5 |
| 3.5 | 5 |
| 4 | 6 |
| 4.5 | 7 |
| 5 | 7 |
| 6 | 9 |
| 7 | 10 |
| 8 | 12 |

Step 112*b*: the amplitude envelope quantization exponent of the $j^{th}$ of the core layer residual signal is calculated according to the amplitude envelope quantization exponent of the coding sub-band j of the core layer and the quantization exponent modification value in Table 8:

$Th_q(j)=Th_q(j)-\text{diff}(\text{region\_bit}(j)), j=0, \ldots ,L\_core-1$ wherein, $Th_q(j)$ is the amplitude envelope quantization exponent of the coding sub-band j in the core layer.

It should be noted that when the bit allocation number of a certain coding sub-band in the core layer is 0, it does not need to modify the coding sub-band amplitude envelope of the core layer residual signal, and at this moment, the sub-band amplitude envelope value of the core layer residual signal is the same with the amplitude envelope value of the coding sub-band of the core layer.

In addition, when the bit allocation number region_bit(j) of a certain coding sub-band of the core layer is 9, the quantization amplitude envelope value of the $j^{th}$ coding sub-band of the core layer residual signal is set to be 0.

Step 113: the bit allocation is performed for each sub-band in the extended layer:

The coding signal of the extended layer is composed of the residual signal of the core layer and the MDCT coefficients above the range of frequency of the core layer. The sub-band division of the extended layer is determined according to Table 1. The coding signals in sub-bands 0, . . . ,L_core−1 are residual signals of the core layer, and the coding signals in L_core, . . . ,L−1 are MDCT coefficients in corresponding sub-bands.

The initial value of the importance of each coding sub-band of the extended layer is calculated within the whole range of frequency band of the extended layer using the same bit allocation scheme as for the core layer according to the calculated sub-band amplitude envelope quantization exponent of the core layer residual signal, the amplitude envelope quantization exponent of the coding sub-band composed of the MDCT coefficients in the extended layer and the number of available bits in the extended layer, and bits are allocated to each coding sub-band.

In this example, the range of the frequency band of the extended layer is 0-13.6 kHz. The total code rate of the audio stream is 64 kbps, the code rate of the core layer is 32 kbps, and then the maximum code rate of the extended layer is 64 kbps. The total number of available bits in the extended layer is calculated according to the code rate of the core layer and the maximum code rate of the extended layer, and then bit allocation is performed until bits are completely consumed.

Step 114: the coding signal of the extended layer is normalized, vector quantized and coded according to the amplitude envelope quantization exponent of each coding sub-band of the extended layer and the corresponding bit allocation number to obtain the coded bits of the coding signal. Wherein, the vector composition, vector quantization scheme and coding scheme of the coding signal in the extended layer are the same with the vector composition, vector quantization scheme and coding scheme of the frequency domain coefficient in the core layer respectively.

Figure 3:
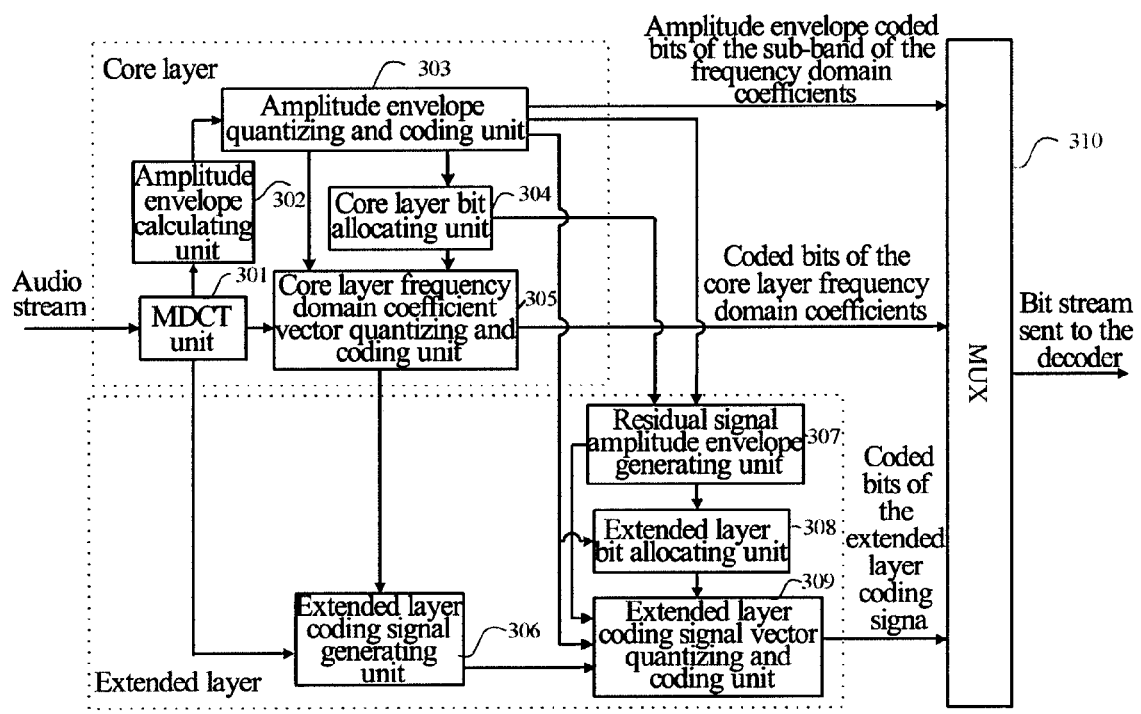
FIG. 3 illustrates the structure of an enhanced hierarchical audio coding system according to Example one of the present invention.
Figure 3A:
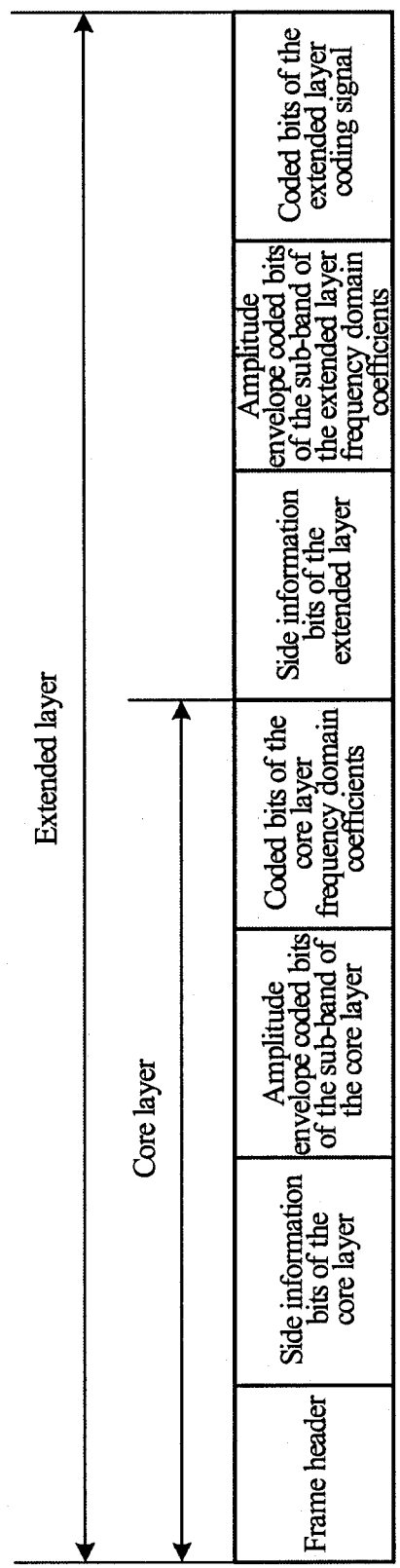
FIG. 3a illustrates a code stream of hierarchical coding according to Example one of the present invention.

Step 115: as shown in FIG. 3*a*, the hierarchical coding code stream is constructed in the following way: firstly writing the side information of the core layer into the a bit stream multiplexer MUX in the following sequence: Flag_huff_rms, Flag_huff_PLVQ_core and count; writing the amplitude envelope coded bits of the coding sub-band of the core layer into MUX, and then writing the coded bits of the frequency domain coefficient of the core layer into MUX; writing the vector coding Huffman coding flag Flag_huff_PLVQ_ext of the extended layer and the number of iterations of the extended layer count_ext into the MUX, writing the amplitude envelope coded bits of the coding sub-band (L_core, ... , L−1) composed of the MDCT coefficients in the extended layer into the MUX, and then writing the coded bits of the coding signal of the extended layer into the MUX; finally transmitting the hierarchical coding code stream written in the above sequence to the decoding end;

wherein, the sequence of writing the coded bits of the coding signal of the extended layer is based on the sequence of the initial values of importance of various coding sub-bands. That is, the coded bits of the coding sub-band with a greater initial value of importance are preferably written into the code stream, and for the coding sub-bands with the same importance, the lower-frequency coding sub-band has the preference.

Since the amplitude envelope of the residual signal in the extended layer is calculated from the amplitude envelope and the bit allocation number of the core layer, it does not need to be transmitted to the decoding end. This can improve the coding accuracy of the bandwidth of the core layer without addition of bits for transmitting the amplitude envelope value of the residual signal.

Step 116: a code rate layer is constructed according to the magnitude of the code rate.

The unnecessary bits at the rear part of the bit stream multiplexer are rejected according to the required code rate at which the bits are transmitted, and the bits whose numbers meets the code rate requirement are transmitted to the decoding end. That is, unnecessary bits are rejected according to the importance of the coding sub-band in an ascending order.

In this example, the range of the coding frequency band is 0-13.6 kHz, the maximum code rate is 64 kbps, and the method for layering based on code rate is as follows:

the MDCT coefficients in the coding frequency band range of 0-6.4 kHz are grouped as a core layer, the maximum code rate corresponding to the core layer is 32 kbps and this layer is marked as L0 layer; the range of the coding frequency band of the extended layer is 0-13.6 kHz, and its maximum code rate is 64 kbps and this layer marked as $L_1\_5$ layer;

before sending to the decoding end, the code rate is divided, according to the number of rejected bits, into $L_1\_1$ layer corresponding to 36 kbps, $L_1\_2$ layer corresponding to 40 kbps, $L_1\_3$ layer corresponding to 48 kbps, $L_1\_4$ layer corresponding to 56 kbps, and $L_1\_5$ layer corresponding to 64 kbps.

Figure 10:
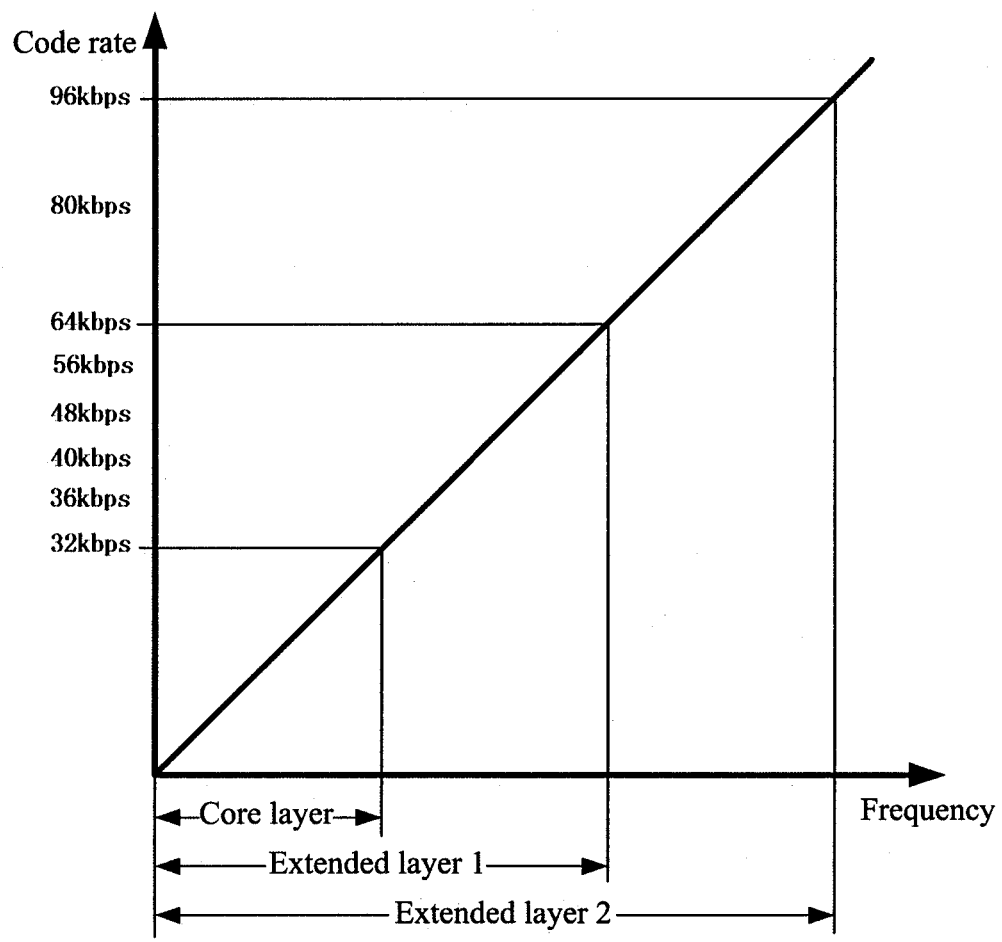
FIG. 10 illustrates the relationship between layer division within the range of frequency bands and layer division according to code rate, according to the present invention.

FIG. 10 illustrates the relationship between layer division within the range of frequency bands and layer division according to code rate.

FIG. 3 illustrates the structure of an enhanced hierarchical audio coding system according to Example one of the present invention. As shown in FIG. 3, the system comprises: an MDCT unit 301, an amplitude envelope calculating unit 302, an amplitude envelope quantizing and coding unit 303, a core layer bit allocating unit 304, a core layer frequency domain coefficient vector quantizing and coding unit 305, an extended layer coding signal generating unit 306, a residual signal amplitude envelope generating unit 307, an extended layer bit allocating unit 308, and an extended layer coding signal vector quantizing and coding unit 309, and a bit stream multiplexer (MUX) 310; wherein:

the MDCT unit is configured to perform MDCT for an input audio signal to generate frequency domain coefficients;

the amplitude envelope calculating unit is configured to divide the frequency domain coefficients output by the MDCT unit into sub-bands, and calculate the frequency domain amplitude envelope value of each coding sub-band. According to the position of the sub-band corresponding to the amplitude envelope, it can be divided into amplitude envelope of the core layer and amplitude envelope of the extended layer;

the amplitude envelope quantizing and coding unit is configured to quantize and code the amplitude envelope value of each coding sub-band output by the amplitude envelope calculating unit to generate a quantization exponent of the sub-band amplitude envelope and coded bits of the amplitude envelope quantization exponent;

the core layer bit allocating unit is configured to calculate the initial value of importance of each coding sub-band according to the quantization exponent of the sub-band amplitude envelope output by the amplitude envelope quantizing and coding unit, and perform bit allocation for the core layer according to the importance of each coding sub-band;

the core layer frequency domain coefficient vector quantizing and coding unit is configured to normalize the frequency domain coefficients of each coding sub-band using the quantized amplitude envelope value of the coding sub-band, and then vector quantize and code the frequency domain coefficients that need to be coded to generate the vector quantization value and coded bits of the frequency domain coefficients;

the extended layer coding signal generating unit is configured to inversely quantize the above vector quantized frequency domain coefficients, and perform a difference calculation with respect to the frequency domain coefficients within the frequency band range of the core layer output by the MDCT unit to obtain a core layer residual signal. The core layer residual signal and the frequency domain coefficients above the range of the core layer output by the MDCT unit constitute the extended layer coding signal;

the residual signal amplitude envelope generating unit is configured to perform sub-band division on the residual signal by the same way as for the frequency domain coefficients, and calculate the amplitude envelope quantization exponent of each coding sub-band of the residual signal according to the amplitude envelope quantization exponent of each coding sub-band of the core layer and the bit allocation number;

the extended layer bit allocating unit is configured to allocate bits to each coding sub-band of the extended layer and generate the bit allocation number of each coding sub-band of the extended layer;

the extended layer coding signal vector quantizing and coding unit is configured to normalize, vector quantize and code the coding signal according to the sub-band amplitude envelope quantization exponent of the extended layer coding signal and the corresponding bit allocation number to obtain coded bits of the coding signal;

the bit stream multiplexer is configured to send the side information, the coded bits of amplitude envelope of each coding sub-band, the coded bits of the core layer frequency domain coefficients, and the coded bits of the extended layer coding signal to the decoding end.

See the description on the flow shown in FIG. 1 for the specific function of each unit (module) in FIG. 3.

Figure 4:
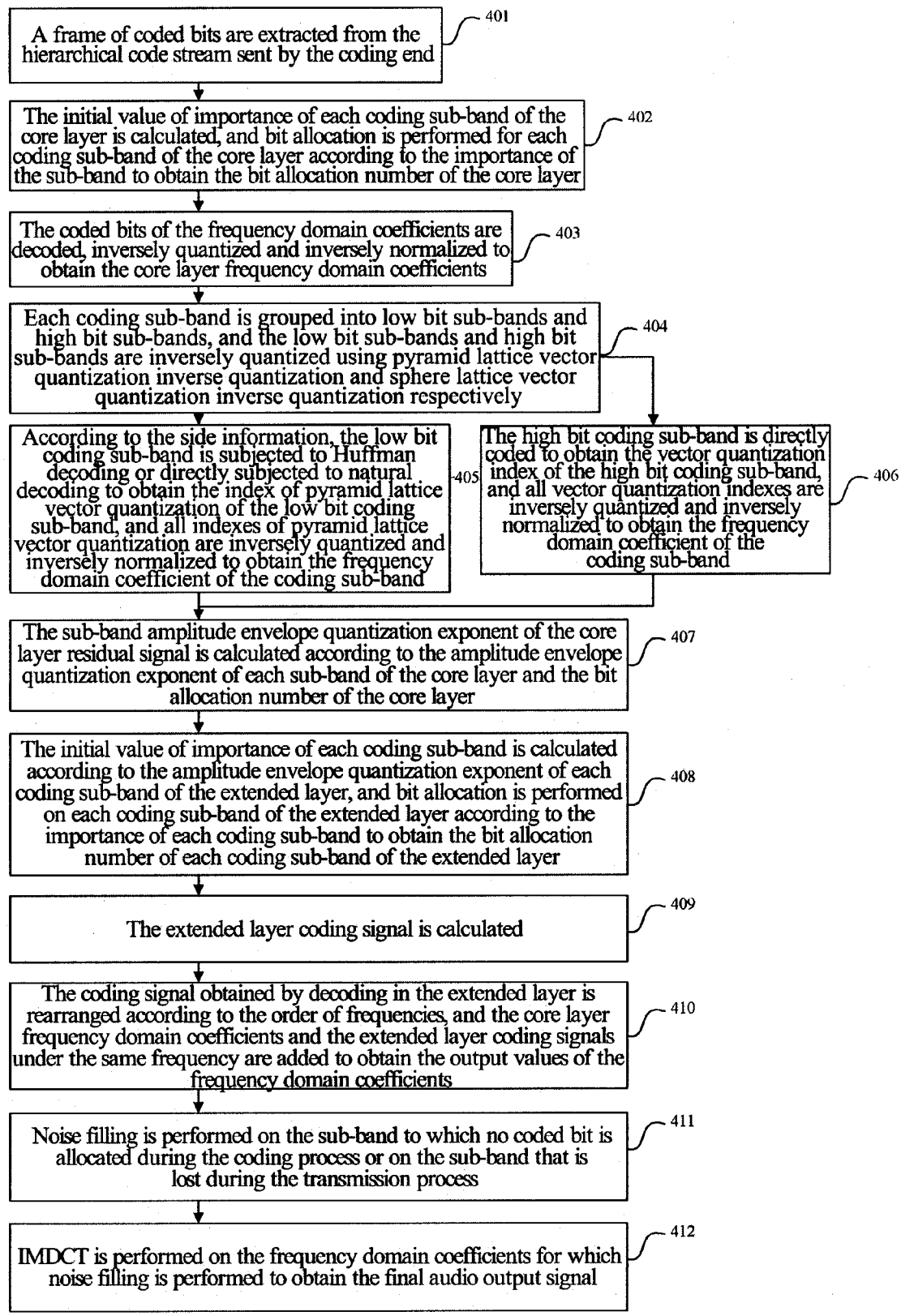
FIG. 4 is a flowchart of an enhanced hierarchical audio decoding method according to Example one of the present invention.

FIG. 4 is a flowchart of an enhanced hierarchical audio decoding method according to Example one of the present invention. As shown in FIG. 4, the method comprises Step 401: a frame of coded bits are extracted from the hierarchical code stream sent by the coding end (i.e., from the bit stream de-multiplexer DeMUX);

after the coded bits are extracted, firstly the side information is decoded, and then the coded bits of each amplitude envelope of the core layer in the frame are Huffman decoded according to the value of Flag_huff_rms or is directly decoded, obtaining the amplitude envelope quantization exponent of each coding sub-band of the core layer, $Th_q(j)$, j=0, . . . ,L_core−1.

Step 402: the initial value of importance of each coding sub-band of the core layer is calculated according to the amplitude envelope quantization exponent of each coding sub-band of the core layer, bit allocation is performed for each coding sub-band of the core layer according to the importance of the sub-band to obtain the bit allocation number of the core layer; the way for bit allocation at the decoding end is exactly the same with the way for bit allocation at the coding end. During the process of bit allocation, the step length of bit allocation and the step length of importance reduction after bit allocation are variable.

After the above bit allocation process is finished, bit allocation is performed on the coding sub-band for another count times according to the bit allocation modification times, count, of the core layer of the coding end, and the importance of each coding sub-band, and then the whole process of bit allocation is over.

During the process of bit allocation, the step length of bit allocation is 1 bit, and the step length of importance reduction after bit allocation is 1 for a coding sub-band whose bit allocation number is 0, the step length of bit allocation for allocating bits additionally is 0.5 bit and the step length of importance reduction after bit allocation is also 0.5 for a coding sub-band whose bit allocation number is greater than 0 and less than a classification threshold, and the step length of bit allocation for allocating bits additionally is 1 bit and the step length of importance reduction after bit allocation is also 1 for a coding sub-band whose bit allocation number is greater than or equal to the classification threshold;

Step 403: the coded bits of the frequency domain coefficients are decoded, inversely quantized and inversely normalized using the bit allocation number of the core layer and the quantization amplitude envelope value of each coding sub-band and according to Flag_huff_PLVQ_core to obtain the core layer frequency domain coefficients.

Step 404: when decoding and inversely quantizing the coded bits of the frequency domain coefficients, each coding sub-band is grouped into a low bit sub-band and a high bit sub-band according to the bit allocation numbers of the coding sub-bands of the core layer, and the low bit sub-band and high bit sub-band are inversely quantized using pyramid lattice vector quantization/inverse quantization and sphere lattice vector quantization/inverse quantization respectively, turning to step 405 and step 406.

Step 405: according to the side information, the low bit coding sub-band is subjected to Huffman decoding or directly subjected to natural decoding to obtain the index of pyramid lattice vector quantization of the low bit coding sub-band, and all indexes of pyramid lattice vector quantization are inversely quantized and inversely normalized to obtain the frequency domain coefficient a of the coding sub-band; turning to step 407.

405a) If Flag_huff_PLVQ=0, decoding is directly performed to obtain the index, index_b(j,m), of the $m^{th}$ vector quantization of the low bit coding sub-band j, and if Flag_huff_PLVQ=1, the index, index_b(j,m), of the $m^{th}$ vector quantization of the low bit coding sub-band j is obtained according to the Huffman coding code table corresponding to the bit allocation number of a single frequency domain coefficient of the coding sub-band;

When the number of bits allocated to a single frequency domain coefficient of the coding sub-band is 1, if the natural binary code value of the quantization index is less than "1111 111", the quantization index is calculated according to the natural binary code value; if the natural binary code value of the quantization index is equal to "1111 111", then it is to continue to read the next bit; if the next bit is 0, then the quantization index is 127, and if the next bit is 1, then the quantization index is 128.

405b) The process of pyramid lattice vector inverse quantization of the quantization index is actually an inverse process of the vector quantization process 107. The inverse quantization process is as follows:

405c) the energy pyramid surface where the vector quantization exponent is located and its label on the pyramid surface are determined:

finding kk in the pyramid surface energy from 2 to LargeK (region_bit(j)) such that the following inequality is met:

$N(8,kk) \leq \text{index\_}b(j,m) < N(8,kk+2)$,

If such a kk is found, then K=kk is the energy of the pyramid surface where the $D_8$ lattice corresponding to the quantization index index_b(j,m) is located, b=index_b(j,m)−N(8,kk) is the index label of the $D_8$ lattice on the pyramid surface where it is located;

if such a kk can not be found, the pyramid surface energy K of the $D_8$ lattice corresponding to the quantization index index_b(j,m) is equal to 0, and the index label is 0;

405d) the specific steps for solving the $D_8$ lattice vector Y=(y1, y2 y3, y4, y5, y6, y7, y8) whose pyramid surface energy is K and the index label is b are as follows:

Step 1: let Y=(0,0,0,0,0,0,0,0), xb=0, i=1, k=K, l=8;
Step 2: if b=xb, then yi=0; skip to step 6;
Step 3: if b<xb+N(l−1,k), then yi=0, skip to step 5; otherwise, xb=xb+N(l−1,k); let j=1;
Step 4: if b<xb+2*N(l−1,k−j), then
if xb<=b<xb+N(l−1,k−j), then yi=j;
if b>=xb+N(l−1,k−j), then yi=−j, xb=xb+N(l−1, k−j);
otherwise, xb=xb+2*N(l−1, k−j), j=j+1; proceed with this step;
Step 5: update k=k−|yi|, l=l−1, i=i+1, if k>0, skip to step 2;
Step 6: if k>0, then y8=k−|yi|, Y=(y1, y2, . . . , y8) is the lattice to be solved.

405e) perform energy inverse regulation on the solved $D_8$ lattice, obtaining $\overline{Y}_j^m = (Y+a)/\text{scale(index)}$ wherein, a=$(2^{-6}, 2^{-6}, 2^{-6}, 2^{-6}, 2^{-6}, 2^{-6}, 2^{-6}, 2^{-6})$, scale (index) are scaling factors and can be inquired in Table 2.

405f) Inverse normalization is performed on $\overline{Y}_j^m$ to obtain the frequency domain coefficients of the $m^{th}$ vector of the coding sub-band j that is restored by the decoding end:

$\overline{X}_j^m = 2^{Th_q(j)/2} \Box \overline{Y}_j^m$ wherein, $Th_q(j)$ is the amplitude envelope quantization exponent of the $j^{th}$ coding sub-band.

Step 406: the high bit coding sub-band is directly coded to obtain the vector quantization index of the high bit coding sub-band, and all vector quantization indexes are inversely quantized and inversely normalized to obtain the frequency domain coefficient of the coding sub-band.

Natural coding is directly performed on the coded bits of the high bit coding sub-band to obtain the $m^{th}$ index vector k of the high bit coding sub-band j, and the inverse quantization process of performing sphere lattice vector quantization on the index vector is actually an inverse process of the quantization process, and its specific steps are as follows:

406a) calculate x=k*G, and calculate ytemp= x/(2^(region_bit(j))); wherein, k is the index vector of vector quantization, region_bit(j) represents the bit allocation number of a single frequency domain coefficient in the coding sub-band j; G is the generator matrix of $D_8$ lattice, whose form is as follows:

$$G = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \end{bmatrix}$$

406b) calculate y=x−$f_{D8}$(ytemp)*(2^(region_bit(j)));

406c) perform energy inverse regulation on the $D_8$ to be solved, obtaining $$\overline{Y}_j^m = y * scale(\text{region\_bit}(j))/(2^{\text{region\_bit}(j)}) + a$$

Wherein, a=($2^{-6}$, $2^{-6}$, $2^{-6}$, $2^{-6}$, $2^{-6}$, $2^{-6}$, $2^{-6}$, $2^{-6}$) scale (region_bit(j)) are scaling factors and can be inquired in Table 3.

406d) perform inverse normalization on $\overline{Y}_j^m$ to obtain the frequency domain coefficient of the $m^{th}$ vector of the coding sub-band j that is restored by the decoding end:

$$\overline{X}_j^m = 2^{Th_q(j)/2} \square \overline{Y}_j^m$$

wherein, $Th_q(j)$ is the amplitude envelope quantization exponent of the $j^{th}$ coding sub-band.

Step 407: the sub-band amplitude envelope quantization exponent of the core layer residual signal is calculated according to the amplitude envelope quantization exponent of each sub-band of the core layer and the bit allocation number of the core layer; the calculating way at the decoding end is exactly the same with the calculating way at the coding end.

Each amplitude envelope coded bit above the range of the core layer frequency domain is Huffman decoded according to the value of Flag_huff_rms or directly decoded to obtain the amplitude envelope quantization exponent, Thq(j), j=,L_core, . . . ,L−1, of the corresponding coding sub-band of the extended layer.

Step 408: the extended layer coding signal is composed by the core layer residual signal and the extended layer frequency domain coefficient, and the initial value of importance of each coding sub-band is calculated according to the amplitude envelope quantization exponent of each coding sub-band of the extended layer, and bit allocation is performed for each coding sub-band of the extended layer according to the importance of each coding sub-band to obtain the bit allocation number of each coding sub-band of the extended layer; the way for calculating the initial value of importance of the coding sub-band and the way for allocating bits at the decoding end are the same with the way for calculating the initial value of importance of the coding sub-band and the way for allocating bits at the coding end.

Step 409: the extended layer coding signal is calculated.

The coded bits of the coding signal are decoded and inversely quantized according to the bit allocation number of the extended layer, and the data for which inverse quantization has been performed are inverse normalized using the quantization amplitude envelope value of each coding sub-band of the extended layer to obtain the coding signal of the extended layer.

The way for decoding and the way for inverse quantization in the extended layer are the same with the ways for decoding and inverse quantization in the core layer.

In this step, the order of decoding each coding sub-band is determined by an initial value of importance of each coding sub-band. If there are two coding sub-bands with the same importance, then a lower-frequency coding sub-band is preferentially decoded, and meanwhile the number of decoded bits is calculated, and decoding is terminated when the number of decoded bits meets requirements on the total number of bits.

For example, the code rate for transmitting from the coding end to the decoding end is 64 kbps, but the decoding end can only obtain the information of the former 48 kbps of the code stream due to network reasons, or the decoding end can only support decoding of 48 kbps, therefore, decoding is terminated when the decoding end decodes at 48 kbps.

Step 410: the coding signal obtained by decoding in the extended layer is rearranged according to the order of frequencies, and the core layer frequency domain coefficients and the extended layer coding signals under the same frequency are added to obtain the output value of the frequency domain coefficients.

Step 411: noise filling is performed for the sub-band to which no coded bit is allocated during the coding process or the sub-band that is lost during the transmission process.

Step 412: IMDCT (Inverse Modified Discrete Cosine Transform) is performed for the frequency domain coefficients after noise filling is performed to obtain the final audio output signal.

Figure 5:
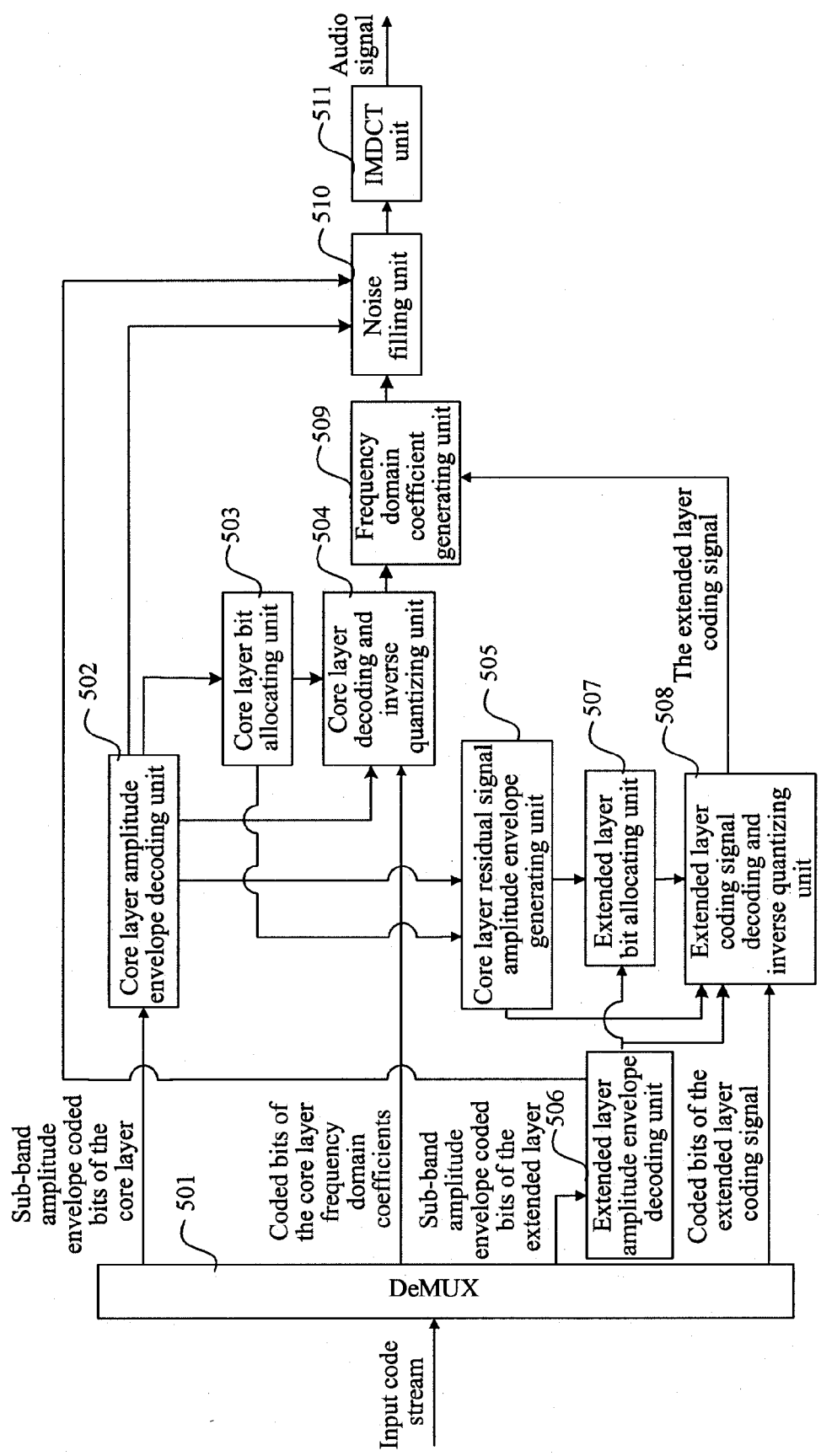
FIG. 5 illustrates the structure of the enhanced hierarchical audio decoding system according to Example one of the present invention.

FIG. 5 illustrates the structure of the enhanced hierarchical audio decoding system according to Example one of the present invention. As shown in FIG. 5, the system comprises: a bit stream de-multiplexer (DeMUX) 501, a core layer amplitude envelope decoding unit 502, a core layer bit allocating unit 503, and a core layer decoding and inverse quantizing unit 504, a core layer residual signal amplitude envelope generating unit 505, an extended layer amplitude envelope decoding unit 506, an extended layer bit allocating unit 507, an extended layer coding signal decoding and inverse quantizing unit 508, a frequency domain coefficient generating unit 509, a noise filling unit 510 and an IMDCT unit 511; wherein:

the bit stream de-multiplexer is configured to output amplitude envelope coded bits, frequency domain coefficient coded bits and extended layer coding signal coded bits;

the core layer amplitude envelope decoding unit is configured to perform Huffman decoding according to the value of Flag_huff_rms in the side information or perform direct decoding on the amplitude envelope coded bits of the core layer output by the bit stream de-multiplexer to obtain an amplitude envelope quantization exponent of each coding sub-band of the core layer, $Th_q(j)$, j=0, . . . ,L_core−1;

the core layer bit allocating unit is configured to calculate the initial value of importance of each coding sub-band according to the amplitude envelope quantization exponent of each coding sub-band of the core layer output by the amplitude envelope quantizing and coding unit, and perform bit allocation for each coding sub-band of the core layer according to the importance of each coding sub-band to obtain the bit allocation number of the core layer;

the core layer decoding and inverse quantizing unit is configured to decode, inversely quantize and inversely normalize the coded bits of the frequency domain coefficients using the bit allocation number and the quantization amplitude envelope value of the core layer and according to the value of Flag_huff_PLVQ_core in the side information to obtain the core layer frequency domain coefficients;

the core layer residual signal amplitude envelope generating unit is configured to calculate the amplitude envelope quantization exponent of the corresponding coding sub-band residual signal of the core layer using the amplitude envelope quantization exponent of each coding sub-band of the core layer and the bit allocation number of the core layer;

the extended layer amplitude envelope decoding unit is configured to perform Huffman decoding according to the value of Flag_huff_rms in the side information or perform direct decoding on the amplitude envelope coded bit above the range of the core layer output by the bit stream de-multiplexer to obtain the amplitude envelope quantization exponent, $Th_q(j)$, j=L_core, . . . ,L−1, of the corresponding coding sub-band of the extended layer;

the extended layer bit allocating unit is configured to calculate the initial value of importance of each coding sub-band according to the amplitude envelope quantization exponent of each coding sub-band of the extended layer, and perform bit allocation for each coding sub-band of the extended layer according to the importance of each coding sub-band to obtain the bit allocation number of the extended layer;

the extended layer coding signal decoding and inverse quantizing unit is configured to decode the coded bits of the extended layer coding signal using the bit allocation number of the extended layer, and perform inverse vector quantization and inverse normalization for the decoded data using the quantization amplitude envelope value of the coding sub-band of the extended layer to obtain the coding signal of the extended layer;

the frequency domain coefficient generating unit is configured to add the core layer frequency domain coefficients output by the core layer decoding and inverse quantizing unit and the extended layer coding signal output by the extended layer coding signal decoding and inverse quantizing unit to obtain the frequency coefficient output value;

the noise filling unit is configured to perform noise filling on the coding sub-bands to which no bit is allocated in the frequency coefficient output value output by the frequency domain coefficient generating unit;

the IMDCT unit is configured to perform IMDCT for the frequency domain coefficients after noise filling is performed to obtain the final audio output signal.

Example Two

Figure 6:
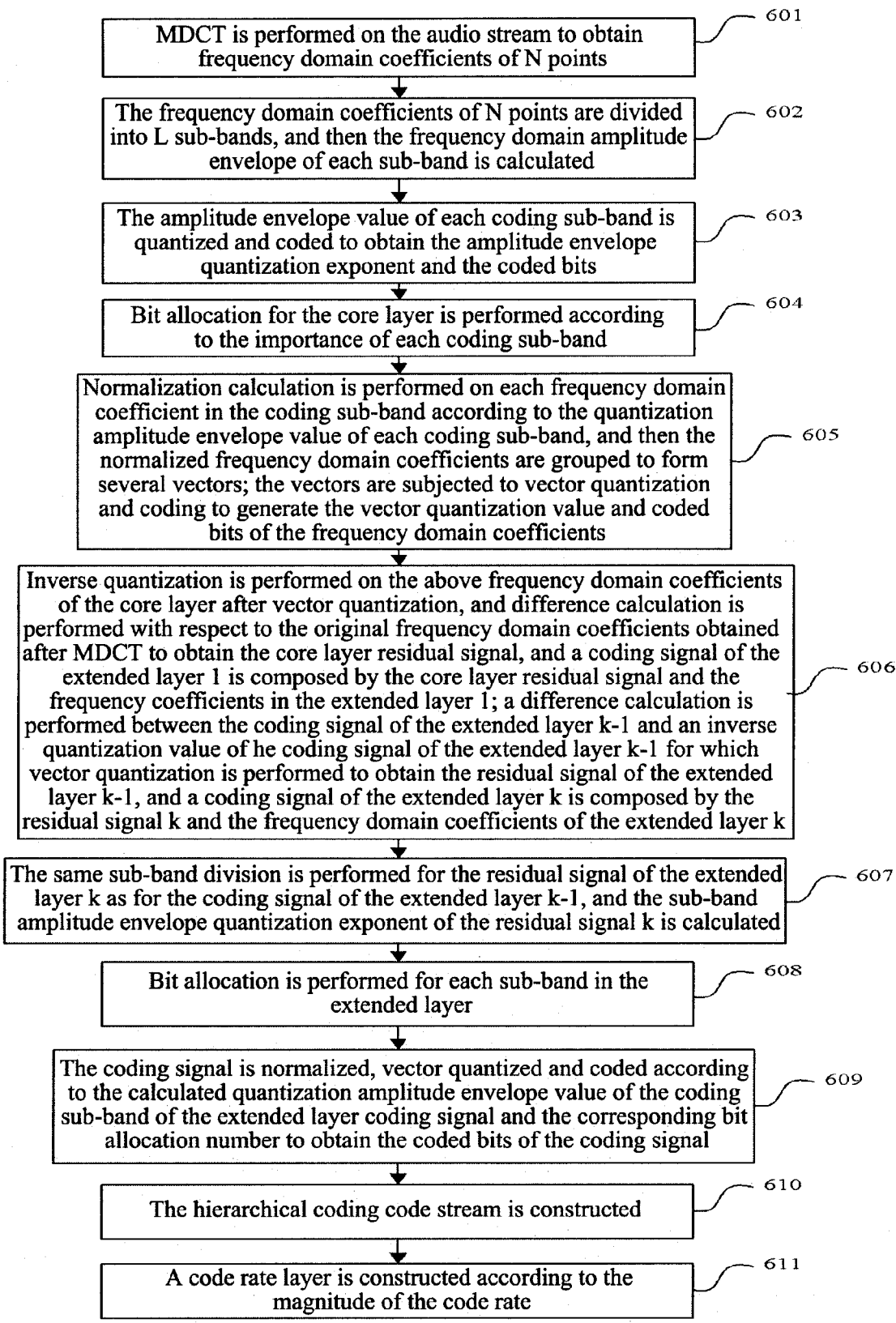
FIG. 6 is a flowchart of an extended hierarchical audio coding method according to Example two of the present invention.

FIG. 6 is a flowchart of an extended hierarchical audio coding method according to Example two of the present invention. In this example, the hierarchical audio coding method of the present invention will be described by taking an audio stream with a frame length of 20 ms and a sampling rate of 48 kHz as an example. The method of the present invention is also applicable in other conditions of frame length and sampling rate. As shown in FIG. 6, the method comprises:

Step 601: MDCT (Modified Discrete Cosine Transform) is performed on the audio stream with a frame length of 20 ms and a sampling rate of 48 kHz to obtain N points of frequency domain coefficients. In this example, N=960.

See step 101 for the specific method for implementing this step.

Step 602: the frequency domain coefficients of N points are divided into several unequal sub-bands, and then the frequency domain amplitude envelope (referred to as amplitude envelope for short) of each sub-band is calculated.

102*a*: the frequency domain coefficients within the range of a frequency band to be coded are divided into L sub-bands (which may be called as coding sub-bands);

In this example, the range of the frequency band to be coded is 0-20 kHz, and it can be divided into sub-bands according to human auditory perceptive characteristics unequally. Table 9 provides a specific dividing mode.

In Table 9, the frequency domain coefficients within the range of the frequency band of 0-20 kHz are divided into 36 coding sub-bands, i.e., L=36; the frequency domain coefficients above 20 kHz are set to be 0.

In this example, the frequency domain range of the core layer is also divided. The sub-bands numbered from 0 to 15 in Table 9 are selected as the sub-bands of the core layer, there are L_core=16 sub-bands in total, and the frequency band range of the core layer is 0-6.4 kHz; the sub-bands numbered from 0 to 27 in Table 9 are selected as the sub-bands of extended layer 1, there are L1=28 sub-bands in total, and the frequency band range of extended layer 1 is 0-13.6 kHz; the sub-bands numbered from 0 to 35 in Table 9 are selected as the sub-bands of extended layer 2, there are L1=36 sub-bands in total, and the frequency band range of extended layer 2 is 0-20 kHz.

TABLE 9

Coding sub-bands in Example two

| Serial number of the sub-band | Starting frequency point (LIndex) | Ending frequency point (HIndex) | Bandwidth of the sub-band (BandWidth) |
| --- | --- | --- | --- |
| 0 | 0 | 7 | 8 |
| 1 | 8 | 15 | 8 |
| 2 | 16 | 23 | 8 |
| 3 | 24 | 31 | 8 |
| 4 | 32 | 47 | 16 |
| 5 | 48 | 63 | 16 |
| 6 | 64 | 79 | 16 |
| 7 | 80 | 95 | 16 |
| 8 | 96 | 111 | 16 |
| 9 | 112 | 127 | 16 |
| 10 | 128 | 143 | 16 |
| 11 | 144 | 159 | 16 |
| 12 | 160 | 183 | 24 |
| 13 | 184 | 207 | 24 |
| 14 | 208 | 231 | 24 |
| 15 | 232 | 255 | 24 |
| 16 | 256 | 279 | 24 |
| 17 | 280 | 303 | 24 |
| 18 | 304 | 327 | 24 |
| 19 | 328 | 351 | 24 |
| 20 | 352 | 375 | 24 |
| 21 | 376 | 399 | 24 |
| 22 | 400 | 423 | 24 |
| 23 | 424 | 447 | 24 |
| 24 | 448 | 471 | 24 |
| 25 | 472 | 495 | 24 |
| 26 | 496 | 519 | 24 |
| 27 | 520 | 543 | 24 |
| 28 | 544 | 575 | 32 |
| 29 | 576 | 607 | 32 |
| 30 | 608 | 639 | 32 |
| 31 | 640 | 671 | 32 |
| 32 | 672 | 703 | 32 |
| 33 | 704 | 735 | 32 |
| 34 | 736 | 767 | 32 |
| 35 | 768 | 799 | 32 |

See step 102 for the specific method for calculating the amplitude envelope of each coding sub-band.

Step 603: the amplitude envelope value of each coding sub-band is quantized and coded to obtain the amplitude envelope quantization exponent and the coded bits of the amplitude envelope of each coding sub-band, and the coded bits of the amplitude envelope need to be transmitted to the MUX.

See step 103 for the specific method for implementing this step.

Step 604: the initial value of importance of each coding sub-band is calculated according to the code rate distortion theory and the amplitude envelope information of the coding sub-band, and bit allocation for the core layer is performed according to the importance of each coding sub-band of the core layer.

See step 104 for the specific method for implementing this step.

Step 605: the normalization calculation is performed on each frequency domain coefficient in the coding sub-band according to the quantization amplitude envelope value ($2^{Th_q(j)/2}$) of each coding sub-band of the core layer, and then the normalized frequency domain coefficients are grouped to form several vectors; the vectors are subjected to vector quantization and coding to generate the vector quantization value and coded bits of the frequency domain coefficients; the coded bits of the frequency domain coefficients need to be transmitted to the MUX.

See steps 105-110 for the specific method for implementing this step.

Step 606: the inverse quantization is performed on the above frequency domain coefficients of the core layer for which the vector quantization has been performed, and the difference calculation is performed with respect to the original frequency domain coefficients obtained after MDCT to obtain the core layer residual signal, which is marked as residual signal 1, and a coding signal of the extended layer 1 is composed by the residual signal 1 and the frequency coefficients of the extended layer 1; similarly, the difference calculation is performed between the coding signal of the extended layer k−1 and an inverse quantization value of the coding signal of the extended layer k−1 for which the vector quantization has been performed to obtain the residual signal of the extended layer k−1, which is marked as residual signal k, and a coding signal of the extended layer k is composed by the residual signal k and the frequency domain coefficients of the extended layer k.

Step 607: the same sub-band division is performed for the residual signal k as for the coding signal of the extended layer k−1, and the sub-band amplitude envelope quantization exponent of the residual signal k is calculated.

The coding sub-band amplitude envelope quantization exponent of the residual signal 1 can be calculated according to the sub-band amplitude envelope quantization exponent of the core layer and the bit allocation number of the core layer. Similarly, the coding sub-band amplitude envelope quantization exponent of the residual signal in a higher extended layer can be calculated using the coding sub-band amplitude envelope quantization exponent of the residual signal in a lower extended layer and the bit allocation number of the lower extended layer; that is, the sub-band amplitude envelope quantization exponent of the residual signal k in the extended layer k (k>1) is calculated according to the coding sub-band amplitude envelope quantization exponent of the coding signal of the extended layer k−1 and the corresponding modification value.

See step 112 for the specific method for implementing this step.

Step 608: the bit allocation is performed for each sub-band in the extended layer (i.e. performing bit allocation for each coding sub-band of each extended layer coding signal).

The initial value of the importance of each coding sub-band is calculated in each extended layer using the same bit allocation scheme as in the core layer according to the calculated amplitude envelope quantization exponent of the extended layer coding signal, and the bit allocation is performed for each coding sub-band; in this example, the total code rate of the audio stream is 96 kbps, the code rate of the core layer is 32 kbps, and then the maximum code rate of the extended layer 1 is 64 kbps, and the maximum code rate of the extended layer 2 is 96 kbps. The number of available bits in each extended layer is calculated respectively, and then the bit allocation is performed until bits are completely consumed. The way for bit allocation in each extended layer is the same with the way for bit allocation in the core layer.

Step 609: the coding signal is normalized, vector quantized and coded according to the calculated quantization amplitude envelope value of the coding sub-band of the extended layer coding signal and the corresponding bit allocation number to obtain the coded bits of the coding signal. Wherein, the vector composition of the coding signal, vector quantization way and coding way in each extended layer are the same with the vector composition of the frequency domain coefficient, vector quantization way and coding way in the core layer respectively.

Figure 6A:
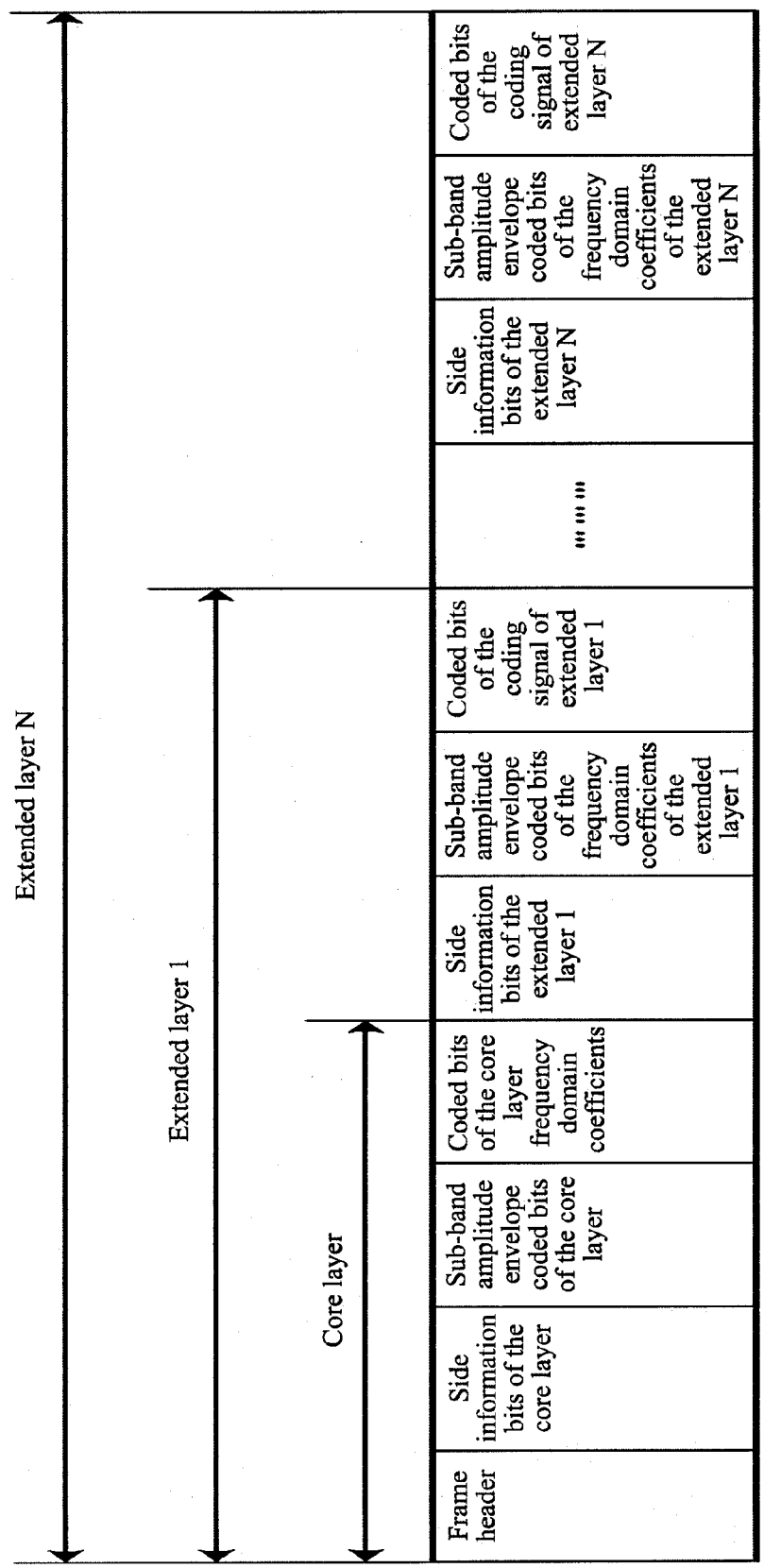
FIG. 6a illustrates a code stream of hierarchical coding according to Example two of the present invention.

Step 610: as shown in FIG. 6a, the hierarchical coding code stream is constructed in the following way: firstly writing the side information of the core layer into the a bit stream multiplexer MUX in the following sequence: Flag_huff_rms, Flag_huff_PLVQ_core and count; writing the amplitude envelope coded bits of the coding sub-band of the core layer into MUX, and then writing the coded bits of the frequency domain coefficient of the core layer into MUX; writing Flag_huff_PLVQ and count in the extended layer into the MUX according to the order of each extended layer, writing the amplitude envelope coded bits of the coding sub-band of the extended layer frequency domain coefficients into the MUX, and then writing the coded bits of the coding signal into the MUX; finally transmitting the hierarchical coding code stream written with the above sequence to the decoding end;

wherein, the order of writing the coded bits of the coding signal is: writing the coded bits of each extended layer into the code stream according to the order of the extended layers from low to high; that is, writing the side information, coding sub-band amplitude envelope coded bits of frequency domain coefficients and coded bits of coding signal of the (k−1)$^{th}$ extended layer before writing the side information, coding sub-band amplitude envelope coded bits of frequency domain coefficients and coded bits of coding signal of the k$^{th}$ extended layer. In each extended layer, the order of writing coded bits of the coding signal is based on the order of the initial importance of each sub-band; that is, the coding signal coded bits of the sub-band with a greater initial importance is preferentially written into the code stream.

Step 611: a code rate layer is constructed according to the magnitude of the code rate.

The unnecessary bits at the rear part of the bit stream multiplexer are rejected according to the code rate required for transmitting, and the bits whose number meets the code rate requirement are transmitted to the decoding end. That is, unnecessary bits are rejected according to the importance of the coding sub-band in an ascending order.

In this example, the range of the coding frequency band is 0-20 kHz, the maximum code rate is 96 kbps, and the way for layering based on code rate is as follows:

the MDCT frequency domain coefficients in the coding frequency band range of 0-6.4 kHz are grouped as a core layer, the maximum code rate corresponding to the core layer is 32 kbps and this layer is marked as L0 layer;

the coding frequency band range of the extended layer 1 is 0-13.6 kHz, its maximum code rate is 64 kbps and this layer is marked as L$_1$_5 layer; the coding frequency band range of the extended layer 2 is 0-20 kHz, its maximum code rate is 96 kbps and this layer is marked as $L_2\_2$ layer;

before sending to the decoding end, according to the number of rejected bits, the part between $L_1\_5$ layer and $L_2\_2$ layer is further grouped into $L_2\_1$ layer corresponding to 80 kbps, and $L_2\_2$ layer corresponding to 96 kbps.

FIG. 10 illustrates the relationship between the layer division within the range of frequency bands and the layer division according to code rate.

Figure 7:
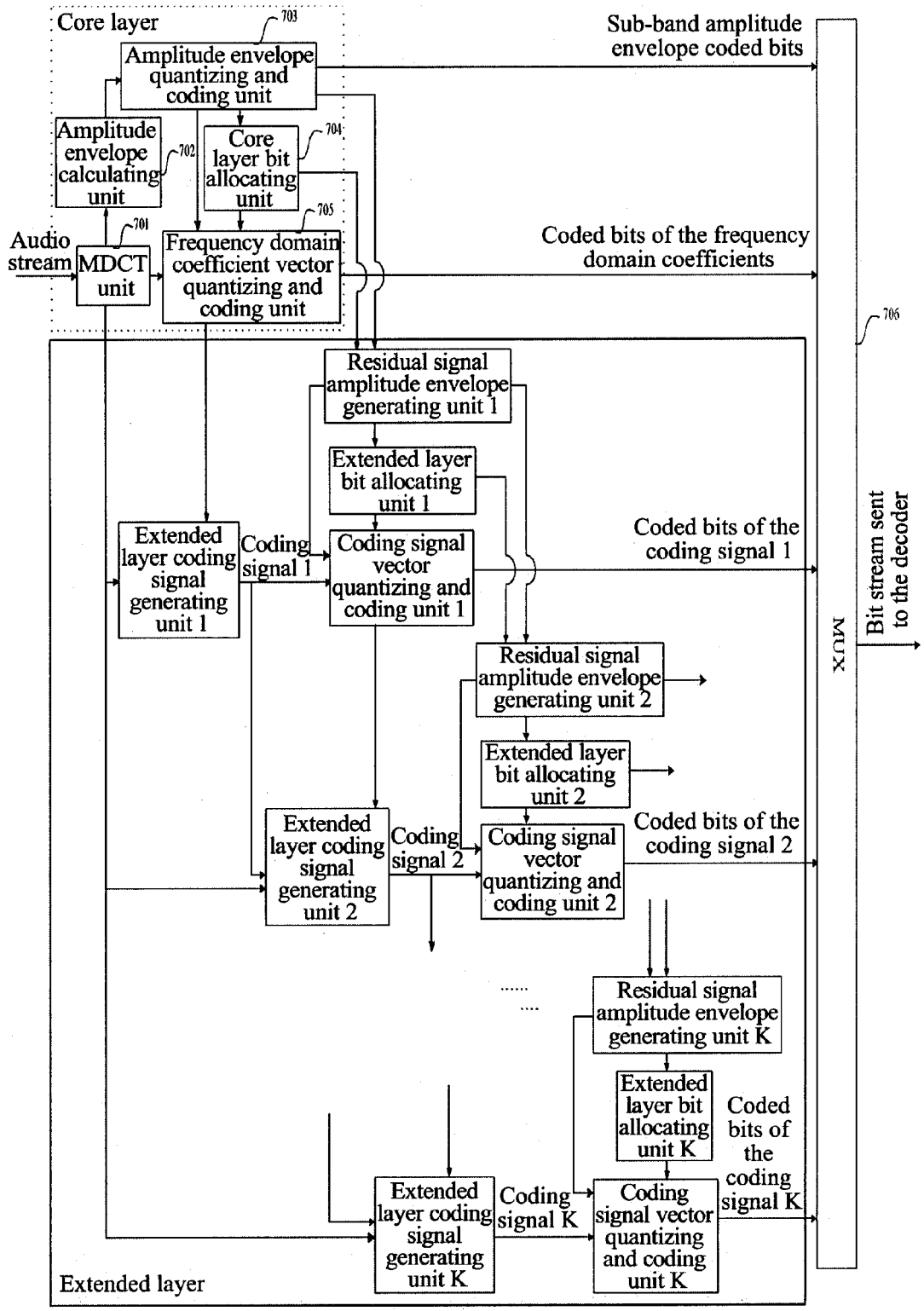
FIG. 7 illustrates the structure of an extended hierarchical audio coding system according to Example two of the present invention.

FIG. 7 illustrates the structure of an extended hierarchical audio coding system according to Example two of the present invention. As shown in FIG. 7, the system comprises: an MDCT unit 701, an amplitude envelope calculating unit 702, an amplitude envelope quantizing and coding unit 703, a core layer bit allocating unit 704, a frequency domain coefficient vector quantizing and coding unit 705, an extended layer coding signal generating unit, a residual signal amplitude envelope generating unit, an extended layer bit allocating unit, and a coding signal vector quantizing and coding unit; and a multi-path multiplexer 706.

In FIG. 7, in order to clearly describe the data interaction relationship between various extended layers, the extended layer coding signal generating unit is further divided into: extended layer coding signal generating units 1 to K; the residual signal amplitude envelope generating unit is further divided into: residual signal amplitude envelope generating units 1 to K; the extended layer bit allocating unit is further divided into: extended layer bit allocating units 1 to K; the coding signal vector quantizing and coding unit is further divided into: coding signal vector quantizing and coding units 1 to K.

The MDCT unit is configured to perform MDCT for an input audio signal to generate frequency domain coefficients;

the amplitude envelope calculating unit is configured to divide frequency domain coefficients output by the MDCT unit into sub-bands and calculate an amplitude envelope value of each coding sub-band;

the amplitude envelope quantizing and coding unit is configured to quantize and code the amplitude envelope values of each coding sub-bands output by the amplitude envelope calculating unit to generate an amplitude envelope quantization exponent and coded bits of amplitude envelope of each coding sub-band;

the core layer bit allocating unit is configured to allocate bits to the core layer according to the amplitude envelope quantization exponent of each coding sub-band of the core layer output by the amplitude envelope quantizing and coding unit;

the frequency domain coefficient vector quantizing and coding unit is configured to normalize the frequency domain coefficients of each coding sub-band using the quantized amplitude envelope value of the coding sub-band in the core layer, and then vector quantize and code the frequency domain coefficients that need to be coded to generate the vector quantization value and coded bits of the frequency domain coefficients of the core layer;

the extended layer coding signal generating unit 1 is configured to inversely quantize the frequency domain coefficients for which the vector quantization has been performed output by the frequency domain coefficient vector quantizing and coding unit, and perform difference calculation with respect to the frequency domain coefficients output by the MDCT unit to obtain the residual signal (marked as residual signal 1), and residual signal 1 and the frequency domain coefficients of extended layer 1 constitute the coding signal of the extended layer 1 (marked as coding signal 1);

the extended layer coding signal generating unit i+1 is configured to inversely quantize the coding signal i for which the vector quantization has been performed output by the coding signal vector quantizing and coding unit i of extended layer i, and perform difference calculation with respect to the coding signal i for which the vector quantization has not been performed output by the extended layer coding signal generating unit i to obtain the residual signal of extended layer i (marked as a residual signal i+1), and the residual signal i+1 and the frequency domain coefficients of the extended layer i+1 constitute the coding signal of the extended layer i+1 (marked as coding signal i+1); wherein, i=1, . . . ,K−1, K is the number of the extended layers.

The residual signal amplitude envelope generating unit 1 is configured to divide the residual signals of the core layer into sub-bands in the same way as for the frequency domain coefficients of the core layer, and calculate the amplitude envelope quantization exponent of the sub-band of the core layer residual signal (residua signal 1) according to the amplitude envelope quantization exponent of the coding sub-band of the core layer and the bit allocation number of the core layer;

the residual signal amplitude envelope generating unit i+1 is configured to calculate the coding sub-band amplitude envelope quantization exponent of the residual signal (residual signal i+1) of the extended layer i according to the coding sub-band amplitude envelope quantization exponent and the bit allocation number of the extended layer i;

the extended layer bit allocating unit i is configured to allocate bits to each coding sub-band of the extended layer i and generate the bit allocation number of each coding sub-band of the extended layer i; wherein, i=1, . . . ,K, K is the number of the extended layers;

the coding signal vector quantizing and coding unit i is configured to normalize, vector quantize and code the coding signal using the coding sub-band quantization amplitude envelope value and the corresponding bit allocation number of the coding signal of the extended layer i to obtain coded bits of the coding signal i; wherein, i=1, . . . ,K, K is the number of the extended layers;

the multi-path multiplexer is configured to send the side information, the coded bits of amplitude envelope of each coding sub-band of the frequency domain coefficients, the coded bits of the core layer frequency domain coefficients, the side information of each extended layer, and the coded bits of the extended layer coding signal to the decoding end.

Figure 8:
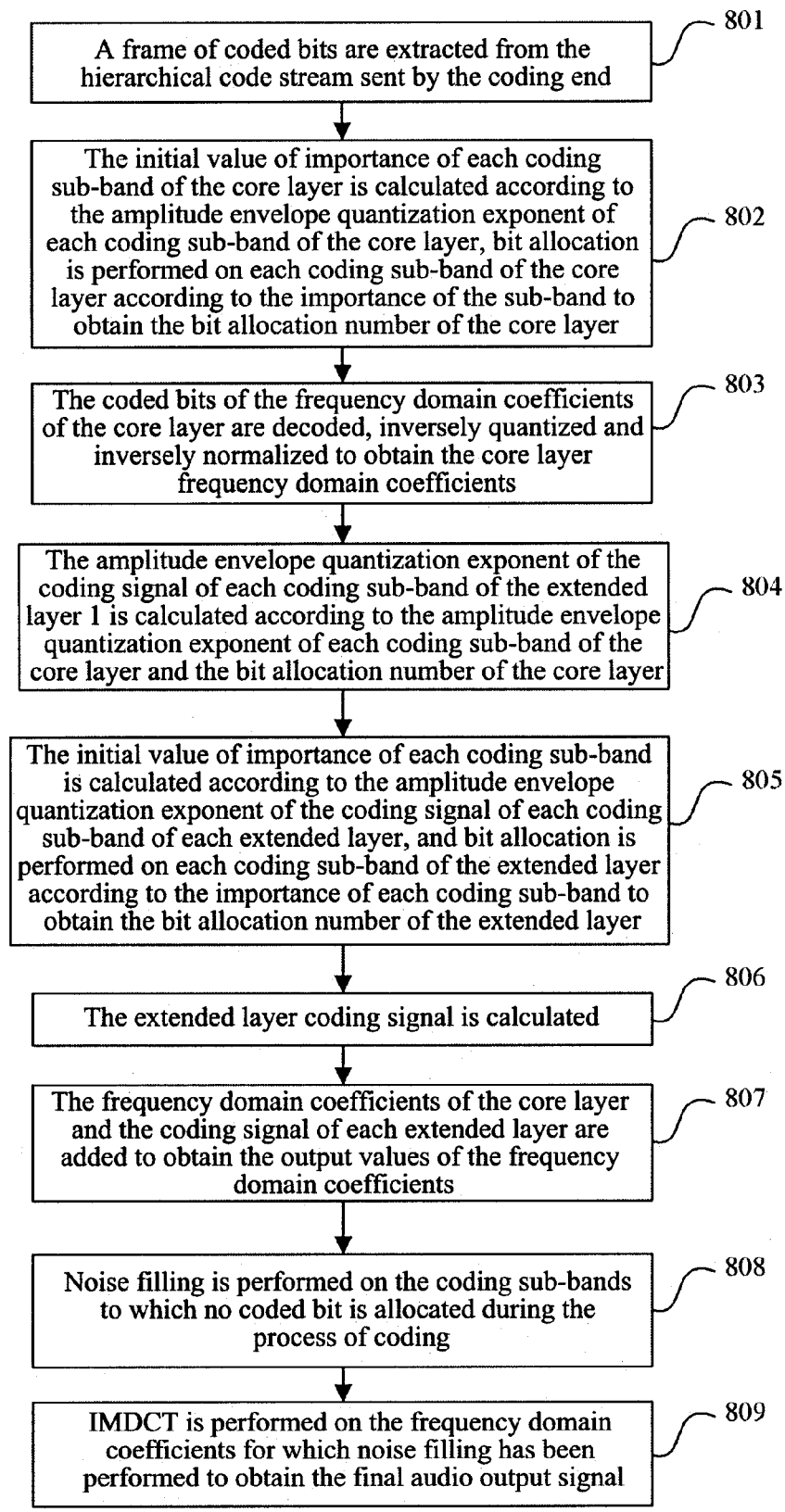
FIG. 8 is a flowchart of an extended hierarchical audio decoding method according to Example two of the present invention.

FIG. 8 is a flowchart of an extended hierarchical audio decoding method according to Example two of the present invention. As shown in FIG. 8, the method comprises Step 801: a frame of coded bits are extracted from the hierarchical code stream sent by the coding end (i.e., from the multi-path separator DeMUX);

after the coded bits are extracted, firstly the side information is decoded, and then the coded bits of each amplitude envelope in the frame is Huffman decoded according to the value of Flag_huff_rms or is directly decoded, obtaining the amplitude envelope quantization exponent of each coding sub-band of the core layer, $Th_q(j)$, j=0, . . . ,L_core−1.

Step 802: the initial value of importance of each coding sub-band of the core layer is calculated according to the amplitude envelope quantization exponent of each coding sub-band of the core layer, bit allocation is performed for each coding sub-band of the core layer according to the importance of the sub-band to obtain the bit allocation number of the core layer (i.e., Region_bit(j), j=0, . . . , L_core−1); the way for bit allocation at the decoding end is exactly the same with the way for bit allocation at the coding end. During the process of bit allocation, the step length for bit allocation and the step length of importance reduction after bit allocation are variable.

After the above bit allocation process is finished, bit allocation is performed on the coding sub-band for another count times according to the bit allocation modification times, count, of the core layer of the coding end, and the importance of each coding sub-band, and then the whole process of bit allocation is over.

During the process of bit allocation, the step length of bit allocation is 1 bit, and the step length of importance reduction after bit allocation is 1 for a coding sub-band whose bit allocation number is 0; the step length of bit allocation for allocating bits additionally is 0.5 bit and the step length of importance reduction after bit allocation is also 0.5 for a coding sub-band whose bit allocation number is greater than 0 and less than a classification threshold; and the step length of bit allocation for allocating bits additionally is 1 bit and the step length of importance reduction after bit allocation is also 1 for a coding sub-band whose bit allocation number is greater than or equal to the classification threshold;

Step 803: the coded bits of the frequency domain coefficients of the core layer are decoded, inversely quantized and inversely normalized using the bit allocation number of the core layer and the quantization amplitude envelope value ($2^{Th_q(j)/2}$) of each coding sub-band and according to Flag_huff_PLVQ to obtain the core layer frequency domain coefficients.

Step 804: the amplitude envelope quantization exponent of each coding sub-band of the core layer residual signal is calculated according to the amplitude envelope quantization exponent of each coding sub-band of the core layer and the bit allocation number of the core layer; the calculating way at the decoding end is exactly the same with the calculating way at the coding end. The residual signal of the core layer and the frequency domain coefficients of extended layer 1 constitute the coding signal of extended layer 1.

Similarly, the coding sub-band amplitude envelope quantization exponent of the residual signal in a higher extended layer is calculated using the coding sub-band amplitude envelope quantization exponent of the coding signal in a lower extended layer and the bit allocation number of the lower extended layer; that is, the sub-band amplitude envelope quantization exponent of the residual signal in the extended layer i-1 is calculated according to the coding sub-band amplitude envelope quantization exponent of the coding signal of the extended layer i-1 and the corresponding modification value. The residual signal of the extended layer i-1 and the frequency domain coefficients of the extended layer i constitute the coding signal of extended layer i.

Step 805: the initial value of importance of each coding sub-band is calculated according to the amplitude envelope quantization exponent of the coding signal of each coding sub-band of each extended layer, and bit allocation is performed for each coding sub-band of the extended layer according to the importance of each coding sub-band to obtain the bit allocation number of the extended layer; the way for calculating the initial value of importance of the coding sub-band and the way for allocating bits at the decoding end are the same with the way for calculating the initial value of importance of the coding sub-band and the way for allocating bits at the coding end.

Step 806: the extended layer coding signal is calculated.

The coded bits of the coding signal are decoded and inversely vector quantized according to the bit allocation number of the extended layer, and the inversely quantized data are inversely normalized using the quantization amplitude envelope value of each coding sub-band of the coding signal of the extended layer to obtain the coding signal of the extended layer.

In this step, the order of decoding the coding signal of each extended layer is from a lower extended layer to a higher extended layer, and the order of decoding the coding signal of each coding sub-band in an identical extended layer is determined by the initial value of importance of each coding sub-band. If there are two coding sub-bands with the same importance, then a lower-frequency coding sub-band is preferentially decoded, and meanwhile the number of decoded bits is calculated, and decoding is terminated when the number of decoded bits meets requirements on a total number of bits.

Step 807: the frequency domain coefficients of the core layer and the coding signal of each extended layer are added to obtain the output value of the frequency domain coefficients.

Step 808: noise filling is performed on the coding sub-bands to which no coded bit is allocated during the process of coding;

Step 809: IMDCT is performed for the frequency domain coefficients for which noise filling has been performed to obtain the final audio output signal.

Figure 9:
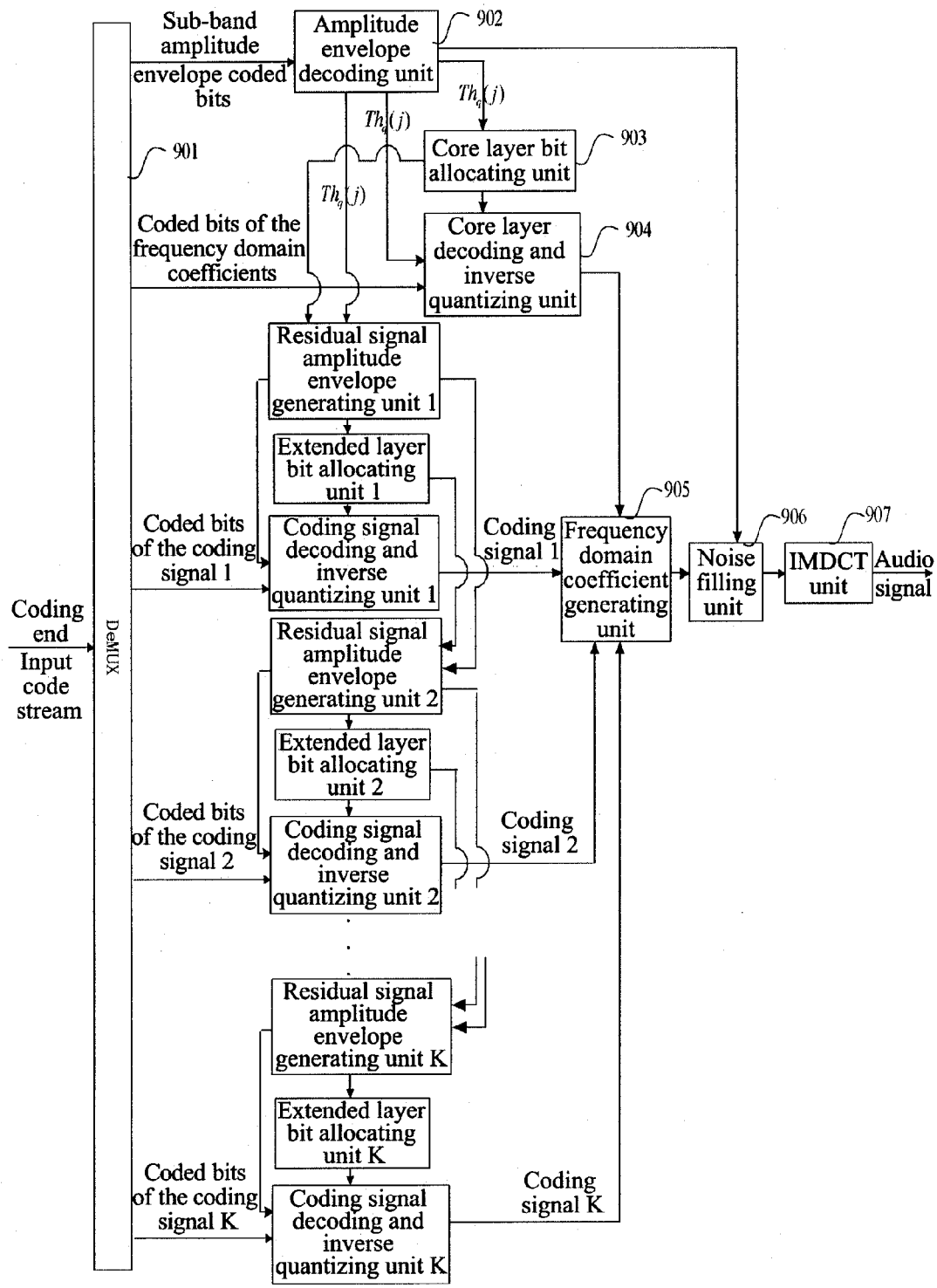
FIG. 9 illustrates the structure of the extended hierarchical audio decoding system according to Example two of the present invention.

FIG. 9 illustrates the structure of the extended hierarchical audio decoding system according to Example two of the present invention. As shown in FIG. 9, the system comprises: a bit stream de-multiplexer (DeMUX) 901, an amplitude envelope decoding unit 902, a core layer bit allocating unit 903, and a core layer decoding and inverse quantizing unit 904, a residual signal amplitude envelope generating unit, an extended layer bit allocating unit, a coding signal decoding and inverse quantizing unit, a frequency domain coefficient generating unit 905, a noise filling unit 906 and an IMDCT unit 907.

In FIG. 9, in order to clearly describe the data interaction relationship between various extended layers, the residual signal amplitude envelope generating unit is further divided into: residual signal amplitude envelope generating units 1 to K; the extended layer bit allocating unit is further divided into: extended layer bit allocating units 1 to K; the coding signal decoding and inverse quantizing unit is further divided into: coding signal decoding and inverse quantizing units 1 to K.

the bit stream de-multiplexer is configured to output amplitude envelope coded bits, frequency domain coefficient coded bits, and coding signal coded bits of each extended layer;

the amplitude envelope decoding unit is configured to perform Huffman decoding according to the value of Flag_huff_rms in the side information or perform direct decoding on the amplitude envelope coded bits output by the bit stream de-multiplexer to obtain an amplitude envelope quantization exponent of each coding sub-band of the core layer, $Th_q(j)$, j=0, . . . ,L_core-1;

the core layer bit allocating unit is configured to calculate the initial value of importance of each coding sub-band of the core layer according to the amplitude envelope quantization exponent of each coding sub-band of the core layer output by the amplitude envelope decoding unit, and perform bit allocation for each coding sub-band of the core layer according to the importance of each coding sub-band to obtain the bit allocation number of the core layer (i.e., Region_bit(j), j=0, . . . , L_core-1);

the core layer decoding and inverse quantizing unit is configured to decode, inversely quantize and inversely normalize the coded bits of the frequency domain coefficients using the bit allocation number of the core layer and the quantization amplitude envelope value ($2^{Th_q(j)/2}$) of each coding sub-band and according to the value of Flag_huff_PLVQ in the side information to obtain the core layer frequency domain coefficients;

the residual signal amplitude envelope generating unit 1 is configured to calculate the amplitude envelope quantization exponent of the residual signal of each coding sub-band of the core layer according to the amplitude envelope quantization exponent of each sub-band of the core layer and the bit allocation number of the core layer;

the residual signal amplitude envelope generating unit i+1 is configured to calculate the amplitude envelope quantization exponent of the residual signal of each coding sub-band of extended layer i using the amplitude envelope quantization exponent of each coding sub-band of extended layer i and the bit allocation number of extended layer i; wherein, $i=1, \ldots, K-1$, K is the number of the extended layers;

the extended layer bit allocating unit i is configured to calculate the initial value of importance of each coding sub-band of extended layer i according to the amplitude envelope quantization exponent of the coding signal of each coding sub-band of extended layer i, and perform bit allocation for each coding sub-band of extended layer i according to the importance of each coding sub-band of extended layer i to obtain the bit allocation number of the extended layer i; wherein, $i=1, \ldots, K$, K is the number of the extended layers;

the coding signal decoding and inverse quantizing unit 1 is configured to decode and inversely quantize the coded bits of the coding signal i according to the bit allocation number of the extended layer i, and inversely normalize the inversely quantized data using the quantization amplitude envelope value of the coding sub-band of the coding signal of the extended layer i to obtain the coding signal of the extended layer i; wherein, $i=1, \ldots, K$, K is the number of the extended layers;

the frequency domain coefficient generating unit is configured to add the core layer frequency domain coefficients output by the core layer decoding and inverse quantizing unit with the coding signal of each extended layer output by the coding signal decoding and inverse quantizing unit to obtain the frequency coefficient output value;

the noise filling unit is configured to perform noise filling on the sub-bands to which no coded bit is allocated among the frequency domain coefficient output values output by the frequency domain coefficient generating unit;

the IMDCT unit is configured to perform IMDCT for the frequency domain coefficients for which noise filling has been performed to obtain the final audio output signal.

A person having ordinary skill in the art can appreciate that all or part of the steps in the above step can be implemented by instructing related hardware through a grogram, which may be stored in a computer readable storage medium, such as read-only memory, disk or an optical disk, and so on. Optionally, all or part of the steps in the above examples can be also implemented using one or more integrated circuits. Correspondingly, each module/unit in the above examples can be implemented in the form of hardware, or in the form of software functional module. The present invention is not limited to any specific form of combination of hardware and software.

Industrial Applicability

In the hierarchical audio coding, decoding method and system, an identical way for sub-band division and bit allocation is applied in the core layer and the extended layer, the amplitude envelope information of the extended layer is calculated according to the amplitude envelope information of the core layer, and the distribution characteristics of the signals themselves are taken into full consideration in bit allocation of both the core layer and the extended layer such that the core layer and the extended layer are closely related with each other, and the code stream of the extended layer does not comprise the amplitude envelope information of the residual signal, thus improving the efficiency of hierarchical audio coding and decoding and meanwhile increasing the utilization ratio of codes.

What is claimed is:

1. A hierarchical audio coding method, comprising following steps:

dividing frequency domain coefficients of an audio signal for which Modified Discrete Cosine Transform (MDCT) has been performed into core layer frequency domain coefficients and extended layer frequency domain coefficients, and dividing the core layer frequency domain coefficients and extended layer frequency domain coefficients into a plurality of coding sub-bands, and quantizing and coding amplitude envelope values of the coding sub-bands;

allocating bits to each coding sub-band of a core layer according to the amplitude envelope value of each coding sub-band of the core layer, and then quantizing and coding the core layer frequency domain coefficients to obtain coded bits of the core layer frequency domain coefficients;

calculating an amplitude envelope value of each coding sub-band of a core layer residual signal according to the amplitude envelope value and a bit allocation number of each coding sub-band of the core layer;

allocating bits to each coding sub-band of an extended layer according to an extended layer coding signal composed of the core layer residual signal and the extended layer frequency domain coefficients and the amplitude envelope value of each coding sub-band composed of the extended layer coding signal, and then quantizing and coding the extended layer coding signal to obtain coded bits of the extended layer coding signal; and multiplexing and packing amplitude value envelope coded bits of each coding sub-band composed of the core layer frequency domain coefficients and the extended layer frequency domain coefficients, coded bits of the core layer frequency domain coefficients, and coded bits of the extended layer coding signal, and then transmitting to a decoding end.

2. The method according to claim 1, wherein, in said step of dividing frequency domain coefficients of an audio signal for which Modified Discrete Cosine Transform (MDCT) has been performed into core layer frequency domain coefficients and extended layer frequency domain coefficients, and dividing the core layer frequency domain coefficients and extended layer frequency domain coefficients into a plurality of coding sub-bands, the frequency domain coefficients after MDCT has been performed are divided into a plurality of uniformly-spaced coding sub-bands, or are divided into a plurality of non-uniform coding sub-bands according to auditory perceptive characteristics; low-frequency coding sub-bands are grouped as core layer coding sub-bands and high-frequency coding sub-bands are grouped as extended layer coding sub-bands.

3. The method according to claim 1, wherein, in said step of quantizing and coding the core layer frequency domain coefficients and the extended layer coding signal, to-be-quantized vectors of a coding sub-band whose bit allocation number is less than a classification threshold are quantized and coded using pyramid lattice vector quantization, and to-be-quantized vectors of a coding sub-band whose bit allocation number is greater than the classification threshold are quantized and coded using sphere lattice vector quantization;

the bit allocation number is a number of bits allocated to a single frequency domain coefficient in one coding sub-band.

4. The method according to claim 1, wherein, in said step of calculating an amplitude envelope value of each coding sub-band of a core layer residual signal according to the amplitude envelope value and a bit allocation number of each coding sub-band of the core layer, the amplitude envelope value of each coding sub-band of the core layer residual signal is calculated by a following way:

inversely quantizing the quantized value of the core layer frequency domain coefficient, and implementing a difference calculation with respect to the core layer frequency domain coefficient to obtain the core layer residual signal;

dividing the core layer residual signal into coding sub-bands by an identical way as for the core layer frequency domain coefficient, and calculating the amplitude envelope value of each coding sub-band of the core layer residual signal according to the amplitude envelope value and the bit allocation number of each coding sub-band of the core layer.

5. The method according to claim 4, wherein, the step of calculating the amplitude envelope value of each coding sub-band of the core layer residual signal comprises:

calculating an amplitude envelope quantization exponent of each coding sub-band of the core layer, and implementing a difference calculation with respect to a quantization exponent modification value of a corresponding coding sub-band to obtain the amplitude envelope quantization exponent of each coding sub-band of the core layer residual signal;

the quantization exponent modification value of each coding sub-band being greater than or equal to 0, and not decreasing when the bit allocation number of the corresponding coding sub-band of the core layer increases; and when the bit allocation number of a coding sub-band of the core layer is 0, the quantization exponent modification value being 0, and when the bit allocation number of the coding sub-band of the core layer is a defined maximum bit allocation number, the amplitude envelope value of the core layer residual signal in the coding sub-band being 0.

6. The method according to claim 1, wherein, said step of obtaining the coded bits of the core layer frequency domain coefficients comprises:

calculating the amplitude envelope quantization exponent of each coding sub-band of the core layer, and allocating bits to each coding sub-band of the core layer; and normalizing the frequency domain coefficients of each coding sub-band according to an quantization amplitude envelope value of each coding sub-band of the core layer reconstructed according to the amplitude envelope quantization exponent of each coding sub-band of the core layer, and quantizing and coding according to the bit allocation number of each coding sub-band of the core layer using pyramid lattice vector quantization and sphere lattice vector quantization respectively to obtain the coded bits of the core layer frequency domain coefficients;

wherein, said step of obtaining the coded bits of the extended layer coding signal comprises:

constituting the extended layer coding signal with the core layer residual signal and the extended layer frequency domain coefficients;

allocating bits to each coding sub-band of the extended layer according to the amplitude envelope quantization exponent of each coding sub-band of the extended layer coding signal; and normalizing the coding signal of each coding sub-band according to an quantization amplitude envelope value of each coding sub-band of the extended layer reconstructed according to the amplitude envelope quantization exponent of each coding sub-band of the extended layer, and quantizing and coding according to the bit allocation number of each coding sub-band of the extended layer using pyramid lattice vector quantization and sphere lattice vector quantization method respectively to obtain the coded bits of the extended layer coding signal.

7. The method according to claim 1, wherein, in said step of multiplexing and packing amplitude value envelope coded bits of each coding sub-band composed of the core layer frequency domain coefficients and the extended layer frequency domain coefficients, coded bits of the core layer frequency domain coefficients, and coded bits of the extended layer coding signal, and then transmitting to the decoding end, multiplexing and packing are implemented according to a following code stream format:

writing side information bits of the core layer after a frame header of a code stream, writing the amplitude value envelope coded bits of the coding sub-band of the core layer into a bit stream multiplexer MUX, and then writing the coded bits of the core layer frequency domain coefficients into the MUX; and writing side information bits of the extended layer into the MUX, writing the amplitude value envelope coded bits of the coding sub-band of the extended layer frequency domain coefficients into the MUX, and then writing the coded bits of the extended layer coding signal into the MUX;

the bits whose number meets a required code rate are sent to the decoding end according to the required code rate.

8. The method according to claim 7, wherein, the side information of the core layer includes Huffman coding flag bits of the coding sub-band amplitude envelope composed of MDCT coeffcients, Huffman coding flag bits of the core layer frequency domain coefficients, and bits of a number of iterations;

the side information of the extended layer includes Huffman coding flag bits of the extended layer coding signal and bits of a number of iterations.

9. The method according to claim 7, wherein, said step of sending the bits whose number meets the required code rate to the decoding end comprises:

coding the core layer and the extended layer within a range of a whole frequency band in which coding is needed according to a number of bits for a defined maximum coding rate such that the maximum coding rate is reached within a range of the coding frequency band;

after the coded bits of the core layer, writing the coded bits of the extended layer coding signal into the bit stream multiplexer according to an initial value of importance of each coding sub-band in a descending order; and sending the bits whose number meets the required code rate to the decoding end based on a principle that the coded bits of the coding sub-band with a smaller initial value of importance are firstly rejected;

wherein, the code rate corresponding to the core layer is marked as L0 layer, each code rate corresponding to the extended layer is marked as L1_1 layer, L1_2 layer, . . . , up to L1_K layer according to a number of rejected bits of the extended layer respectively, wherein, the code rate of the L1_K layer is precisely the maximum coding rate.

10. The method according to claim 1, wherein, after said step of dividing frequency domain coefficients of an audio signal for which Modified Discrete Cosine Transform (MDCT) has been performed into core layer frequency domain coefficients and extended layer frequency domain coefficients, the method further comprises: dividing the frequency domain coefficients of the extended layer, in an ascending order of frequencies, into M parts, which are frequency domain coefficients of extended layers from extended layer 1 to extended layer M respectively, wherein, the frequency for the frequency domain coefficient in an extended layer 1 is lowest and the frequency for the frequency domain coefficient in an extended layer M is highest;

after said step of quantizing and coding the core layer frequency domain coefficients, the method further comprises: inversely quantizing the quantized value of the core layer frequency domain coefficient, and implementing a difference calculation with respect to the core layer frequency domain coefficient to obtain the core layer residual signal;

in said step of calculating an amplitude envelope value of each coding sub-band of a core layer residual signal according to the amplitude envelope value and a bit allocation number of each coding sub-band of the core layer, the core layer residual signal is divided into coding sub-bands by a same way as for the core layer, and the amplitude envelope value of each coding sub-band of the core layer residual signal is calculated according to the amplitude envelope value and the bit allocation number of each coding sub-band of the core layer;

in said step of allocating the bits to each coding sub-band of an extended layer according to an extended layer coding signal composed of the core layer residual signal and the extended layer frequency domain coefficients and the amplitude envelope value of each coding sub-band composed of the extended layer coding signal, and then quantizing and coding the extended layer coding signal to obtain coded bits of the extended layer coding signal, the coding signal of the extended layer 1 is constituted with the core layer residual signal and the frequency domain coefficient of the extended layer 1, the amplitude envelope quantization exponent of each coding sub-band is calculated according to the coding signal of extended layer 1, and bits are allocated to each coding sub-band of the extended layer 1; the coding signal of the extended layer 1 is quantized and coded according to the bit allocation number of each coding sub-band of the extended layer 1;

the quantized value of the coding signal of an extended layer i is inversely quantized, and a difference calculation is implemented with respect to the coding signal of the extended layer i to obtain a residual signal of the extended layer i;

the residual signal of the extended layer i is divided into coding sub-bands by a same way as for the extended layer i, and the amplitude envelope value of each coding sub-band of the residual signal of the extended layer i is calculated according to the amplitude envelope value and the bit allocation number of each coding sub-band of the extended layer i;

the coding signal of an extended layer i+1 is constituted with the residual signal of the extended layer i and the frequency domain coefficient of the extended layer i+1, and bits are allocated to each coding sub-band of the extended layer i+1 according to the amplitude envelope quantization exponent of each coding sub-band of the coding signal of the extended layer i+1; and the coding signal of each coding sub-band of the extended layer i+1 is normalized, vector quantized and coded according to a quantization amplitude envelope value and a number of coded bits of each coding sub-band of the extended layer i+1 reconstructed according to the amplitude envelope quantization exponent of each coding sub-band of the extended layer i+1 to obtain the coded bits of the coding signal of the extended layer i+1;

said i=1, . . . . N−1, and N is a positive integer greater than 2.

11. The method according to claim 1, wherein, when multiplexing and packing amplitude value envelope coded bits of each coding sub-band composed of the core layer frequency domain coefficients and the extended layer frequency domain coefficients, the coded bits of the core layer frequency domain coefficients, and the coded bits of the extended layer coding signal, multiplexing and packing are implemented according to a following code stream format:

after the coded bits of the core layer, according to a number of the extended layer, writing the bits of an extended layer with a smaller serial number into a bit stream multiplexer MUX, and then writing the bits of an extended layer with a greater serial number into the bit stream multiplexer MUX;

in an identical extended layer, firstly writing side information bits of the extended layer into the MUX, writing the amplitude value envelope coded bits of the coding sub-band of the extended layer frequency domain coefficients into the MUX, and then writing the coded bits of the extended layer coding signal into the MUX;

sending the bits whose number meets a required code rate to the decoding end according to the required code rate.

12. A hierarchical audio decoding method, comprising following steps:

de-multiplexing a bit stream sent by a coding end, and decoding amplitude envelope coded bits of core layer frequency domain coefficients to obtain an amplitude envelope value of each coding sub-band of a core layer;

allocating bits to each sub-band of the core layer according to the amplitude envelope value of each coding sub-band of the core layer, and calculating an amplitude envelope value of a core layer residual signal; decoding amplitude envelope coded bits of extended layer frequency domain coefficients to obtain an amplitude envelope value of the extended layer frequency domain coefficients; allocating bits to each coding sub-band of an extended layer according to the amplitude envelope value of the core layer residual signal and amplitude envelope value of the extended layer frequency domain coefficients; and respectively decoding coded bits of the core layer frequency domain coefficients and coded bits of an extended layer coding signal according to a bit allocation number of the core layer and a bit allocation number of the extended layer to obtain the core layer frequency domain coefficients and the extended layer coding signal, rearranging the extended layer coding signal according to an order of frequency bands and adding with the core layer frequency domain coefficients to obtain frequency domain coefficients of a whole bandwidth, performing inverse Modified Discrete Cosine Transform (IMDCT) on the frequency domain coefficients of the whole bandwidth to obtain an output audio signal.

13. The method according to claim 12, wherein, the step of calculating the amplitude envelope value of the core layer residual signal comprises:
    calculating an amplitude envelope quantization exponent of each coding sub-band of the core layer, and implementing a difference calculation with respect to a quantization exponent modification value of a corresponding coding sub-band to obtain the amplitude envelope quantization exponent of each coding sub-band of the core layer residual signal;
    calculating the amplitude envelope value of each sub-band of the residual signal of an extended layer i according to the amplitude envelope and the bit allocation number of each coding sub-band of the extended layer i;
    the quantization exponent modification value of each coding sub-band being greater than or equal to 0, and not decreasing when the bit allocation number of the corresponding coding sub-band of the core layer increases; and
    when the bit allocation number of a coding sub-band of the core layer is 0, the quantization exponent modification value being 0, and when the bit allocation number of the coding sub-band is a defined maximum bit allocation number, the amplitude envelope value of the core layer residual signal in the coding sub-band being 0.

14. The method according to claim 12, wherein, said step of obtaining the core layer frequency domain coefficients and the extended layer coding signal comprises:
    decoding, inversely quantizing and inversely normalizing the coded bits of the core layer frequency domain coefficients according to the bit allocation number, the quantization amplitude envelope value and side information of each coding sub-band of the core layer to obtain the core layer frequency domain coefficients; and
    decoding, inversely quantizing and inversely normalizing the coded bits of the extended layer coding signal according to the bit allocation number of each coding sub-band of the extended layer, the quantization amplitude envelope value and side information of the extended layer coding signal to obtain the extended layer coding signal.

15. The method according to claim 12, wherein, in said step of decoding the coded bits of the extended layer coding signal,
    the coded bits of the extended layer coding signal are decoded in a following order:
    in different extended layers, an order for decoding various layers is: firstly decoding the coded bits of each coding sub-band and the amplitude envelope of a lower extended layer with a smaller extended layer serial number, and then decoding the coded bits of each coding sub-band and the amplitude envelope of a higher extended layer with a greater extended layer serial number, a number of decoded bits is calculated during the decoding, and decoding is terminated when the number of the decoded bits meets requirements on a total number of bits;
    in an identical extended layer, an order for decoding various sub-bands is determined by an initial value of importance of each coding sub-band, a coding sub-band with a greater importance is preferentially decoded, and if there are two coding sub-bands with the same importance, then a lower-frequency coding sub-band is preferentially decoded, a number of decoded bits is calculated during the decoding, and decoding is terminated when the number of the decoded bits meets requirements on the total number of bits.

16. A hierarchical audio coding system, comprising: a Modified Discrete Cosine Transform (MDCT) unit, an amplitude envelope calculating unit, an amplitude envelope quantizing and coding unit, a core layer bit allocating unit, a core layer frequency domain coefficient vector quantizing and coding unit, and a bit stream multiplexer; the system further comprises: an extended layer coding signal generating unit, a residual signal amplitude envelope generating unit, an extended layer bit allocating unit, and an extended layer coding signal vector quantizing and coding unit; wherein:
    the MDCT unit is configured to perform Modified Discrete Cosine Transform on an input audio signal to generate core layer frequency domain coefficients and extended layer frequency domain coefficients;
    the amplitude envelope calculating unit is configured to group to-be-coded parts in the core layer frequency domain coefficients and extended layer frequency domain coefficients as core layer frequency domain coefficient coding sub-bands and extended layer frequency domain coefficient coding sub-bands, and calculate an amplitude envelope value of each coding sub-band;
    the amplitude envelope quantizing and coding unit is configured to quantize and code the amplitude envelope values of the core layer frequency domain coefficient coding sub-bands and extended layer frequency domain coefficient coding sub-bands to generate an amplitude envelope quantization exponent and coded bits of amplitude envelope of each coding sub-band of the core layer frequency domain coefficients and the extended layer frequency domain coefficients;
    the core layer bit allocating unit is configured to allocate bits to the core layer to obtain a bit allocation number of each coding sub-band of the core layer;
    the core layer frequency domain coefficient vector quantizing and coding unit is configured to normalize, vector quantize and code the frequency domain coefficients of each coding sub-band of the core layer using a quantization amplitude envelope value and bit allocation number of each coding sub-band of the core layer reconstructed according to the amplitude envelope quantization exponent of each coding sub-band of the core layer to obtain coded bits of the core layer frequency domain coefficients;
    the extended layer coding signal generating unit is configured to generate a residual signal, and obtain an extended layer coding signal composed of the residual signal and extended layer frequency domain coefficients;
    the residual signal amplitude envelope generating unit is configured to obtain an amplitude envelope quantization exponent of each coding sub-band of the residual signal according to an amplitude envelope quantization exponent of each coding sub-band of the core layer and a bit allocation number of a corresponding coding sub-band;
    the extended layer bit allocating unit is configured to allocate bits to an extended layer according to the amplitude envelope quantization exponent of each coding sub-band of the residual signal and the amplitude envelope quantization exponent of each coding sub-band of the extended layer frequency domain coefficients to obtain a bit allocation number of each coding sub-band of the extended layer coding signal;

the extended layer coding signal vector quantizing and coding unit is configured to normalize, vector quantize and code the coding signal of each coding sub-band of the extended layer using a quantization amplitude envelope value and bit allocation number of each coding sub-band of the extended layer reconstructed according to the amplitude envelope quantization exponent of each coding sub-band of the extended layer to obtain coded bits of the extended layer coding signal;

the bit stream multiplexer is configured to pack side information bits of the core layer, the coded bits of the amplitude envelope of each coding sub-band of the core layer, the coded bits of the core layer frequency domain coefficients, side information bits of the extended layer, the coded bits of each amplitude envelope of the extended layer frequency domain coefficients, and the coded bits of the extended layer coding signal.

17. The system according to claim 16, wherein, the extended layer coding signal generating unit further comprises a residual signal generating unit and an extended layer coding signal synthesizing unit;

the residual signal generating unit is configured to inversely quantize quantized values of the core layer frequency domain coefficients, and implement a difference calculation with respect to the core layer frequency domain coefficient to obtain a core layer residual signal;

the extended layer coding signal synthesizing unit is configured to synthesize the core layer residual signal and the extended layer frequency domain coefficients in an order of frequency bands to obtain the extended layer coding signal.

18. The system according to claim 16, wherein, the residual signal amplitude envelope generating unit further comprises a quantization exponent modification value obtaining unit and a residual signal amplitude envelope quantization exponent calculating unit;

the quantization exponent modification value obtaining unit is configured to calculate a quantization exponent modification value of each coding sub-band of the residual signal according to the bit allocation number of each coding sub-band of the core layer, wherein, the quantization exponent modification value of each coding sub-band is greater than or equal to 0, and does not decrease when the bit allocation number of the corresponding coding sub-band of the core layer increases; when the bit allocation number of a coding sub-band of the core layer is 0, the quantization exponent modification value is 0, and when the bit allocation number of the coding sub-band is a defined maximum bit allocation number, the amplitude envelope value of the residual signal in the coding sub-band is 0;

the residual signal amplitude envelope quantization exponent calculating unit is configured to implement a difference calculation between an amplitude envelope quantization exponent of each coding sub-band of the core layer and a quantization exponent modification value of a corresponding coding sub-band to obtain the amplitude envelope quantization exponent of each coding sub-band of the core layer residual signal.

19. The system according to claim 16, wherein, the bit stream multiplexer is configured to write the coded bits of the extended layer coding signal into a code stream according to an initial value of importance of each coding sub-band in a descending order, and for the coding sub-bands of same importance, preferably write the coded bits of a lower-frequency coding sub-band into the code stream.

20. A hierarchical audio decoding system, comprising: a bit stream de-multiplexer, a core layer amplitude envelope decoding unit, a core layer bit allocating unit, and a core layer decoding and inverse quantizing unit; the system further comprises: an extended layer amplitude envelope decoding unit, a core layer residual signal amplitude envelope generating unit, an extended layer bit allocating unit, an extended layer coding signal decoding and inverse quantizing unit, a frequency domain coefficient generating unit, a noise filling unit and an inverse Modified Discrete Cosine Transform (IMDCT) unit; wherein:

the core layer amplitude envelope decoding unit is configured to decode amplitude envelope coded bits of coding sub-bands of a core layer output by the bit stream de-multiplexer to obtain an amplitude envelope quantization exponent of each coding sub-band of the core layer;

the core layer bit allocating unit is configured to allocate bits to the core layer to obtain a bit allocation number of each coding sub-band of the core layer;

the core layer decoding and inverse quantizing unit is configured to calculate a quantization amplitude envelope value of each coding sub-band of the core layer according to the amplitude envelope quantization exponent of each coding sub-band of the core layer, and decode, inversely quantize and inversely normalize the coded bits of the core layer frequency domain coefficients output by the bit stream de-multiplexer using the bit allocation number and the quantization amplitude envelope value of each coding sub-band of the core layer to obtain the core layer frequency domain coefficients;

the extended layer amplitude envelope decoding unit is configured to decode the amplitude envelope coded bits of the core layer frequency domain coefficients output by the bit stream de-multiplexer to obtain an amplitude envelope quantization exponent of each coding sub-band of the core layer frequency domain coefficients;

the core layer residual signal amplitude envelope generating unit is configured to calculate an amplitude envelope quantization exponent of each coding sub-band of the residual signal according to the amplitude envelope quantization exponent of each coding sub-band of the core layer and the bit allocation number of a corresponding coding sub-band;

the extended layer bit allocating unit is configured to allocate bits to an extended layer according to the amplitude envelope quantization exponent of each coding sub-band of the residual signal and the amplitude envelope quantization exponent of each coding sub-band of the extended layer frequency domain coefficients to obtain a bit allocation number of each coding sub-band of the extended layer coding signal;

the extended layer coding signal decoding and inverse quantizing unit is configured to calculate a quantization amplitude envelope value of each coding sub-band of the extended layer using the amplitude envelope quantization exponent of each coding sub-band of the extended layer, and decode, inversely quantize and inversely normalize the coded bits of the extended layer coding signal output by the bit stream de-multiplexer using the bit allocation number and the quantization amplitude envelope value of each coding sub-band of the extended layer to obtain the extended layer coding signal;

the frequency domain coefficient generating unit is configured to reorder the extended layer coding signal output by the extended layer coding signal decoding and inverse quantizing unit according to an order of the frequency bands, and then perform sum calculation with the core layer frequency domain coefficients output by the core layer coding signal decoding and inverse quantizing unit to obtain frequency domain coefficient output values;

the noise filling unit is configured to perform noise filling on the coding sub-bands to which no coded bit is allocated during a process of coding;

the IMDCT unit is configured to perform IMDCT on all frequency domain coefficients for which noise filling has been performed to obtain an output audio signal.

21. The system according to claim 20, wherein, the core layer residual signal amplitude envelope generating unit further comprises a quantization exponent modification value obtaining unit and a residual signal amplitude envelope quantization exponent calculating unit;

the quantization exponent modification value obtaining unit is configured to calculate the quantization exponent modification value of each coding sub-band of the residual signal according to the bit allocation number of each coding sub-band of the core layer, and make adjustment according to an absolute value of the frequency domain coefficient of a corresponding coding sub-band, wherein, the quantization exponent modification value of each coding sub-band is greater than or equal to 0, and does not decrease when the bit allocation number of the corresponding coding sub-band of the core layer increases, and if the bit allocation number of a coding sub-band of the core layer is 0, the quantization exponent modification value is 0, and if the bit allocation number of the coding sub-band of the core layer is a defined maximum bit allocation number, the amplitude envelope value of the residual signal in the coding sub-band is 0;

the residual signal amplitude envelope quantization exponent calculating unit is configured to perform a difference calculation between the amplitude envelope quantization exponent of each coding sub-band and the quantization exponent modification value of a corresponding coding sub-band to obtain the amplitude envelope quantization exponent of each coding sub-band of the core layer residual signal.

22. The system according to claim 20, wherein, the extended layer coding signal decoding and inverse quantizing unit is configured such that an order for decoding various sub-bands of the extended layer coding signal is determined by an initial value of importance of each coding sub-band, a coding sub-band with a greater importance is preferentially decoded, and if there are two coding sub-bands with same importance, then a lower-frequency coding sub-band is preferentially decoded, a number of decoded bits is calculated during the decoding, and decoding is terminated when the number of the decoded bits meets requirements on a total number of bits.

* * * * *